United States Patent
Harvey et al.

(10) Patent No.: US 9,282,648 B2
(45) Date of Patent: Mar. 8, 2016

(54) COMPOSITE ELECTRODE AND METHOD OF MANUFACTURE THEREOF

(75) Inventors: Thomas Harvey, North Yorkshire (GB); Timothy George Ryan, Middlesbrough (GB)

(73) Assignee: Epigem Limited, Redcar (GB)

( * ) Notice: Subject to any disclaimer, the term of this patent is extended or adjusted under 35 U.S.C. 154(b) by 0 days.

(21) Appl. No.: 13/696,644

(22) PCT Filed: May 9, 2011

(86) PCT No.: PCT/GB2011/050888
§ 371 (c)(1),
(2), (4) Date: Nov. 7, 2012

(87) PCT Pub. No.: WO2011/138621
PCT Pub. Date: Nov. 10, 2011

(65) Prior Publication Data
US 2013/0056876 A1    Mar. 7, 2013

(30) Foreign Application Priority Data
May 7, 2010 (GB) .................................. 1007669.3

(51) Int. Cl.
*H01L 51/52* (2006.01)
*H05K 3/24* (2006.01)
*H01L 51/00* (2006.01)

(52) U.S. Cl.
CPC ............. *H05K 3/244* (2013.01); *H01L 51/003* (2013.01); *H01L 51/0097* (2013.01); *H01L 51/5212* (2013.01); *H01L 2251/5338* (2013.01); *H01L 2251/5361* (2013.01); *H05K 2201/0108* (2013.01); *Y02E 10/549* (2013.01)

(58) Field of Classification Search
None
See application file for complete search history.

(56) References Cited

U.S. PATENT DOCUMENTS

| 6,284,072 | B1 | 9/2001 | Ryan et al. |
| 8,284,072 | B1 * | 10/2012 | Ruffa et al. ................ 340/690 |
| 2004/0140198 | A1 * | 7/2004 | Cho et al. ................ 204/192.29 |
| 2005/0014361 | A1 * | 1/2005 | Nguyen et al. ............ 438/623 |

(Continued)

FOREIGN PATENT DOCUMENTS

| EP | 2 151 876 | 10/2010 |
| JP | 2006-236626 | 9/2006 |

OTHER PUBLICATIONS www.gunt.de/download/extraction_english.pdf archived Nov. 16, 2008.*

(Continued)

*Primary Examiner* — Robert Bachner
*Assistant Examiner* — Molly Reida
(74) *Attorney, Agent, or Firm* — Fay Sharpe LLP

(57) ABSTRACT

The present invention provides a composite electrode and method of manufacturing such a composite electrode, the method comprising the steps of: providing a first substrate layer with an electrically conducting surface; providing a non-conducting curable material; providing a second substrate layer which has a surface relief pattern defining at least one retaining feature corresponding to a desired metal track pattern; forming a line of contact between the conducting carrier layer and at least a part of the surface relief pattern; depositing curable material onto at least part of the surface relief pattern or the electrically conducting surface along the line of contact; advancing the line of contact and curing the curable material through the second substrate layer; releasing the cured material from the surface relief pattern feature so as to leave behind a surface relief pattern on the conducting carrier layer; depositing a first metal layer onto the exposed regions of the electrically conducting surface of the conducting carrier layer and optionally deposition further metal layers on the first metal layer.

11 Claims, 16 Drawing Sheets

(56) References Cited

U.S. PATENT DOCUMENTS

| | | |
|---|---|---|
| 2006/0180807 A1 | 8/2006 | Bechtel et al. |
| 2009/0065776 A1* | 3/2009 | Scher et al. ............ 257/52 |
| 2010/0141612 A1 | 6/2010 | Desieres et al. |
| 2010/0203235 A1* | 8/2010 | Verschuuren et al. ......... 427/66 |

OTHER PUBLICATIONS

Kang et al., Semitransparent Cu electrode on a flexible substrate and its application in organic light emitting diodes, J. Vac. Sci. Technol. B 25(6), Nov./Dec. 2007, pp. 2637-2641.*

Park, Sooyeon et al., "Nanoscale patterning with the double-layered soft cylindrical stamps by means of UV-nanoimprint lithography", Microelectronic Engineering journal homepage: www.elsevier.com/locate/mee, Microelectronic Engineering 86 (2009) 604-607, 2009 Elsevier B.V.

Hong, Sung-Hoon et al., "UV nanoimprint using flexible polymer template and substrate", Microelectric Engineering, journal homepage: www.elsevier.com/locate/mee, Microelectronic Engineering 86 (2009) 295-298, 2008 Elsevier B.V.

International Search Report, International Application No. PCT/GB2011/050888, May 9, 2011.

* cited by examiner

COMPOSITE ELECTRODE AND METHOD OF MANUFACTURE THEREOF

The present invention relates, in general, to novel methods of manufacturing composite electrodes with improved planarity, conductivity and transparency. The resulting composite electrodes can be used to make improved devices requiring transparent and/or highly planar and conducting electrodes. Examples of such devices include, but are not limited to, displays, photovoltaic cells, thin film transistors, touch screens, electromagnetic wave shielding, biosensors and transparent heater panels.

Examples of molecular electronic devices include emissive displays, as in the case of an organic light emitting display (OLED), electroluminescent displays, plasma displays, or displays which require a backlight or front-light source such as in the case of a liquid crystal display or displays which use ambient light, such as reflective displays. Other displays are known such as bi-stable displays forming so-called electronic paper or "e-readers" and those based on quantum dot technology and other suitable materials. Transistors can be formed by depositing the components of the transistor in thin films to form a thin film transistor (TFT). When an organic material is used as the semi-conductive material in such a device, it is known as an organic thin film transistor (OTFT).

Organic light-emitting diodes (OLEDs) are constructed from multiple functional layers. A typical OLED structure comprises a base anode electrode and a cathode electrode with an organic layer region between and in electrical contact with both electrodes. The organic layer region normally comprises at least one hole transport material and one electron transport material and at least one light emitting material. The anode electrode is normally a high work function transparent metal oxide, such as Indium Tin Oxide (ITO). The cathode electrode is normally a metal, preferably a metal with a low work function. A structure of this kind is normally applied to a supporting substrate such as glass or plastic film. The generated light reaches the observer through the transparent electrode. An OLED with a light-emitting polymer in the electroluminescent layer is also commonly referred to as a polyLED or pLED. An OLED with a light emitting organic small molecule is commonly referred to as an OLED. Commonly, additional layers are added into this basic device structure in order to improve the efficiency, brightness and reliability of the light emission.

OLEDs are commonly made using vacuum deposition techniques. Using these techniques results in very thin layers in the device. The typical layer thickness for each layer in the device is between 5 nm and 60 nm. So the total device thickness, including the low work function cathode electrode, is normally less than 200 nm.

pLED devices are slightly thicker than OLED devices but are still relatively thin (less than 500 nm total thickness). Typical conducting polymer layer thickness ranges between 50 nm and 200 nm. Typical thickness of the light emitting polymer layer is in the range 40 to 80 nm.

The curve of the brightness as a function of the applied voltage of all organic light emitting devices is characterized by a threshold voltage, above which luminescence is observed, and a subsequent, very steep linear increase in brightness. Efficient light emitting devices are characterized by a low threshold voltage, and are operated at low voltages (<5V typical).

Uniform brightness over the emitting surface is important and to enable this, the voltage drop over the cathode and anode must not be too great. In addition to a reduced brightness, the voltage drop also leads to a reduction in the efficiency of the OLED. The effect becomes more pronounced the larger the area of emitting surface.

Considering a square sided device, the percentage drop in luminance from edge to centre is determined by the sheet resistance of the transparent conducting electrode (this being the dominant resistance in the equivalent electrical circuit). Using thin transparent conducting films for the cathode, it can be shown for example that 10% or greater drop in luminance is typically observed for devices where the side length is greater than 6.5 cm (in the case where the transparent conductor is PEDOT:PSS with surface resistance 200 ohm per square) or 20.5 cm (in the case where the transparent conductor is Indium Tin Oxide with surface resistance of 20 ohm per square). These sizes correspond to device areas of 42 $cm^2$ and 420 $cm^2$ respectively.

The resistance of the materials commonly used to make the transparent electrode (such as Indium Tin Oxide (ITO) or PEDOT:PSS (dispersion of polyethylenedioxythiophene and poly (styrene sulfonate)) is limited by their intrinsic resistivity. For example, the specific resistance of ITO is $1 \times 10^{-4}$ ohm·cm (equivalent to 10,000 S/cm conductivity) and that of PEDOT:PSS is in the range $1 \times 10^{-3}$ ohm·cm to $1 \times 10^4$ ohm·cm (conductivity between 1,000 S/cm to $1 \times 10^{-4}$ S/cm) compared to a metal such as silver which has a specific resistance of $0.016 \times 10^{-4}$ ohm·cm (equivalent to 625,000 S/cm). Using these materials alone, the electrode can be made less resistive by making the layer thicker but at the expense of reducing the optical transmission of the electrode. However, making the layer thicker means that the films are slower and more expensive to produce and transparent metal oxides such as ITO become more brittle and prone to cracking, especially on flexible substrates. Typical ITO films have surface resistivity in the range 300 to 10 ohm per square.

In order to reduce the resistance of the transparent electrode used in the OLED device and hence produce a device with much more uniform intensity of light emission, metal lines (sometimes referred to as 'busbars') can be formed in contact with them or a grid-like or mesh-like or periodic pattern of metal electrodes can be used. The optical transmission of the metal grid depends on the width of the wires and the pitch used. Ideally the metal wires should occupy the smallest possible fraction of the area of the device while having low enough surface resistivity to achieve high uniformity of light emission intensity. This means that ideally the metal wires should be infinitely thick and infinitely narrow. In practice, the minimum wire width and maximum aspect ratio (ratio of thickness to width) is limited by the method used to make them. Also the resulting surface resistivity depends on the bulk resistivity of the metal (or metals) used to make the wires and on their geometrical arrangement.

A transparent material, as referred to herein, is a material which, at the thickness used, transmits at least about 60% (e.g. at least about 70%, at least about 80%, at least about 85%) of incident light at a wavelength or range of wavelengths used during operation of the device containing it.

Metal grids or metal busbar lines can also be used in photovoltaic (PV) cells to reduce the resistance of the transparent conducting electrode and hence improve the efficiency of the PV device. For example see "Area-scaling of organic solar cells", Choi, Seungkeun Potscavage, William J. Kippelen, Bernard, Journal of Applied Physics, pages 054507-054507-10, Volume: 106 Issue: 5, September 2009. PV cells are commonly of similar construction to OLEDs; comprising of a transparent electrode, charge transfer layer(s), photocurrent generating layer(s) and counter electrode. In terms of their layer thickness and device thickness they are also commonly the same as OLED devices. Therefore our invention also applies to PV devices.

In some types of organic photovoltaic devices, such as dye sensitised solar cells for example, the electrolyte materials used to form the device are highly corrosive to metals. Therefore, when making large area devices incorporating metal grids or busbar lines, the metal(s) or metal alloys must be chosen carefully to be resistant to chemical attack or must be encapsulated to protect them. See for example WO 2008/053464 entitled "Nickel-Cobalt alloys as current collectors and conductive interconnects and deposition thereof on transparent conductive oxides."

Specifically, the metal or metal alloy can be selected from the group comprising of metal from Groups Va, Via, VIIa, VIII, Ib, IIb, IIIb, IVb, Vb, VIb and the actinides of the Periodic Table of the Elements preferably selected from the group consisting of V, Cr, Mo, W, Mn, Re, Fe, Co, Rh, Ni, Pd, Pt, Cu, Ag, Au, Zn, Cd, Al, C, Si, Sn, Pb, Sb, P, Te, Th and alloys thereof.

Alloys of Co and W can also be electroplated and are known to have good corrosion resistance and have been studied as a substitute for hard Cr plating for corrosion resistance on steel surfaces. "Front report from Europe on surface treatment technology. Plating technology of TNO and IST as substitute of hard Cr plating. Technology development of TNO."; Author; SUZUKI KOICHI, Engineering Materials; VOL. 53; NO. 9; PAGE. 83-87(2005); FIG. 8, REF. 2, Japan.

The metal finish on top of the electrode for using in a photovoltaic cell can be chosen so as to enhance the device efficiency by selecting an electron donor metal such as Palladium or Platinum which is also corrosion resistant.

In some types of molecular electronic device design the transparent electrode is on the top of the device rather than the bottom. This is the case for example with single crystal silicon solar cells or in the case of some solid state dye sensitised solar cells. In this case, the transparent electrode must be provided in a form capable of being applied to the top of the device during manufacture and with a highly planar surface so as to ensure a uniform electrical contact. It is therefore advantageous to be able to provide the transparent electrode on a suitable releasable substrate, such that it can be fixed in place on top of the device and then the carrier substrate removed, leaving only the metal wiring pattern and the embedding dielectric material electrically connected to the top of the device. This has the advantage of minimising the thickness of the top electrode layer, thereby increasing the transparency of the device and minimising the total thickness of the device ensuring that it is as light weight and flexible as possible. Suitable releasable substrates include for example Nitto Revalpha NWS-TS322F SHT or Revalpha 31950E or Revalpha 319Y-4L (Nitto Denko, Japan) thermal release tapes.

WO2007036850 describes a large area organic diode device and method of manufacturing it so as to avoid the problem of poor uniformity of brightness. They use metal busbar lines which are electroplated on top of a hermetic barrier layer deposited on top of the device. Apertures must be formed in the barrier layer and aligned to contact pads connected either to the anode or cathode in order to provide the contacts for plating up the busbar lines. The method involves forming the busbar lines after making the organic diodes—which means separate patterning steps to make anode, cathode and busbars. Also, immersing the whole panel in the plating bath at the end of the process risks additional corrosion, contamination and damage compared to making the busbars part of either the anode or cathode. The density of busbar lines is also limited by the need to separate the contact pads from the light emitting regions. The method also requires depositing a plating base material after opening the apertures and before plating, which needs then to be removed after plating.

US 20030136572 describes the conventional method of manufacturing a metal mesh film whereby sheets of copper are coated with a photoresist, exposed, developed and then the copper is etched away and the resist stripped off after. In this way they made 10 micron thick, 10 micron wide, 300 micron pitch Cu meshes for use in electromagnetic shielding. However the method is limited to fabricating a resulting mesh protruding above the carrier substrate by the thickness of the Cu forming the mesh (10 micron). Such a mesh formed by the method of US 20030136572 is unsuitable for use in organic light emitting diodes or PVs because its use would lead to shorts between electrodes arising from such a thick and rough mesh and the need to deposit sufficient active layers to cover a 10 micron thick mesh. The same problems arise if using printed metal conducting lines (e.g. silver) to form the mesh or busbar pattern, since they stand proud of the substrate by an amount equal to their thickness after printing and drying.

WO2005008800 discloses an electroluminescent device where one of the electrodes is electrically contacted to a metallic structure (such as a copper mesh) with a lower resistance than the device. The methods of manufacture of the metal busbars and grids used include screen printing of silver paste into 350 micron deep sand-blasted grooves or rolling of copper wires into liquid glass. Such methods of manufacture form a copper mesh with a high degree of surface roughness and so whilst used in electroluminescent devices according to WO2005008800 these are not sufficiently precise to ensure that the surface of the copper mesh is sufficiently planar to ensure a uniform thickness of device to be deposited on top and minimise shorting between electrodes.

The prior art fails to recognise the importance of having a highly planar surface interface between an electrode and the device structure made on top of it. This is especially important for polymer LEDs (pLEDs) where the organic layer is deposited through spin coating, which is sensitive to non-flat surfaces. Also, if the interface between the transparent electrode and other the layers of the OLED is not highly planar then electrical short circuits can occur between the anode and cathode, resulting in device failure. Sputtered ITO films typically have non-planarity in the form of sharp spikes on the surface of the film, as shown in FIG. 1.

Referring to FIG. 1, an atomic force microscope image 100 of the surface of a 60 ohm per square sputtered ITO film comprises spikes 102, the average height of which varies, depending on the deposition method and film thickness. Other methods of making metal busbars, such as printing of silver inks, in combination with ITO result in out of flatness by the thickness of the ink layer which is typically a few micron thickness.

When a metallic structure such as a copper mesh is used, the prior art also fails to recognise the importance of selecting the work function of the layer in contact with the metallic structure so as to minimise the energy differences between itself, the metal grid on one side and the layer on the other side. Otherwise, the turn-on voltage of the OLED device is increased and the electrical efficiency of the device is reduced. For example, when using gold as a contact metal of the grid, the grid will have a work function of between 5.1 and 5.5 eV (depending on the exact composition of the gold and its morphology).

FIG. 2 shows an energy level diagram 200 of such an OLED device comprising a gold over Nickel metallic structure 202, a PEDOT:PSS hole injection layer 204 (CLEV-IOS™ HIL 1.1, H C Stark), a poly(vinylcarbazole) (PVK) layer 206, a light emitting polymer layer 208 (using Irppy3-fad tris(2-phenylpyridine) iridium dopant), and a bilayer cathode of a Barium layer 210 and Aluminium layer 212.

An object of the current invention is to provide improved transparent composite electrodes for molecular electronic devices. Improved light emitting devices have bright, efficient and uniform light emission over large area. Photovoltaic devices have improved efficiency over large areas. Novel methods of manufacturing of the devices are described.

In relation to the novel methods of manufacturing, it is the an object of this invention so show an improved process for the rapid manufacture of highly planar and transparent circuit boards using a conducting carrier substrate, electroplating and transfer method. It is also an objective of this invention to show that the novel methods of manufacturing can be used to optimise the surface of the composite electrode so as to optimise the electrical and optical properties of the interface between the composite electrode and devices created using it. It is also an objective of this invention to show that novel products are created by this process. Although similar processes for making circuit boards have been described in the prior art, they are different in several key aspects from the processes described herein and these differences are as follows.

The first difference is that they aim to produce only rigid circuit boards rather than flexible ones as well as rigid ones. This means that they do not have to be concerned with bending, curling and out of flatness of the final boards due to stress locked into the thermosetting or thermoplastic polymer materials used to fix the embedded metal tracking layer to the final carrier plate. These stresses occur primarily due to shrinkage during cure of the thermosetting polymer resin (e.g. phenol formaldehyde), differences in thermal expansion coefficients between the conducting carrier, the thermosetting polymer resin and the final carrier substrate materials and the use of pressures of 1000 psi and above. Typical thermal cure temperatures being in excess of 150° C. The problem is worst when using thin thermoplastic carrier films (<0.2 mm thickness) and adhesive materials of thickness more than 25% of the thickness of the carrier film.

The second difference is that they use photolithography, offset printing or screening to pattern the embedding dielectric (masking layer) whereas this invention uses UV embossing (also sometime referred to as UV imprinting). This is important because it allows the rapid (>1 m/min) and uniform formation of the pattern at very high resolution (lateral feature sizes <10 micron) and without excessive heating or pressure or chemical development processes, by UV curing the dielectric material in contact with a surface relief pattern. This allows the process to be operated in a roll to roll manner which is critical for achieving low cost and high volume of production of the product. Patterning of the masking layer by UV embossing has the further benefit that one than one depth of feature and/or more than one surface texture type can be produced at the same time as determined by the surface relief pattern on the moulding surface.

The third difference is that this invention is used to make a highly transparent circuit boards. So we need to carefully select both the embedding dielectric material and the adhesive coated final carrier substrate, onto which the wiring layer is transferred, to have high optical transparency. Most photoresist materials are coloured for example and so will not be suitable for our process.

The fourth difference is that in this invention we carefully select the conducting carrier to have very low surface roughness so as not to introduce any haze into the finished transparent circuit board and to ensure the best possible flatness. This surface roughness is lower than found on a standard finish stainless steel sheet or foil for example.

The fifth difference is that when not using a parting layer, we must formulate the dielectric material to have the optimum amount of stick and release to the low roughness conducting carrier and the adhesion of the dielectric material to the conducting carrier must be high enough to withstand chemical attack by the plating solution and mechanical attack due to rinsing and film handling.

The sixth difference is that the products of this invention are designed to achieve the optimum performance of the electronic devices built on top of them rather than in the case of a conventional circuit board which is designed to mechanically support and provide interconnections between electronic components mounted onto it. So in a conventional circuit board the primary function of the metal finish on the circuit tracks is to provide good solderability whereas in circuit boards of this invention the primary function of the metal finish is to ensure optimum charge transfer between the circuit board and the material layers coated on top of it. Similarly, the prior art focuses only the generic version of the process based on using a conducting carrier, plating and transferring the circuit off it and does not address the problems which arise when trying to operate this process with different combinations of metals or with different materials for the embedding dielectric and the adhesive used on top of the third substrate (the final carrier substrate) e.g. to provide flexibility, scratch resistance, dielectric properties or larger operating temperature range.

Another object of this invention is to overcome the problem of the conducting carrier quickly becoming damaged by reuse. To do this we provide the conducting carrier as a roll of thin flexible material (for example a plastic carrier film with a metal coating sputtered on top or a thin metal foil or a laminate of metal foil and plastic carrier). In the roll to roll process the conducting carrier film is wound through the machine and repeats of the circuit pattern image embossed onto it. The action of winding the film through the machine ensures a fresh region of the conducting carrier is used each time. After transfer, the conducting carrier remains conveniently on a roll of film, ready to be re-used. If the surface of the conducting carrier needs to be additionally cleaned or treated (or example to re-passivate the surface) then this can be conveniently done rapidly with a roll to roll process.

Large area lighting panels (above about 10×10 cm size) require metallic busbars or grids to have good uniformity of brightness. The OLED device is normally built up on top of the metallic busbars or grids (normal bottom emitting device). In bottom emitting devices made without the benefit of the current invention, the metallic busbar or grid lines protrude above all the layers of the OLED device. Therefore an extra electrical passivation layer must be deposited on top of the device before the top electrode can be deposited to prevent shorting between the anode and the cathode. This is costly and adds extra processing steps increasing the chance of failure compared to devices of the type described in this invention. Therefore, a light emitting device according to embodiments of the present invention eliminates the need for an electrical passivation layer between an anode and cathode of a device.

Although the invention is illustrated using organic light emitting materials, a light emitting device of the type described can also be made using inorganic materials such as Si, Zn, Ga, In, Al, their oxides, nitrides and other compounds thereof.

The present invention of a composite electrode can be used for any molecular electronic device in which a highly planar, highly conductive surface is desired. These devices include light emitting devices where the light emitting medium can be emissive in the case of an organic or plasma display, or require a backlight source such as in the case of a liquid crystal display. Other displays are known such as bi-stable displays forming so-called electronic paper and those based on quantum dot technology and other suitable materials. Transistors may also be fabricated on the electrode. Biological materials can be cultured and biological activity sensed.

Other aspects of this invention relate to novel processes for the manufacture of the composite electrode.

The process preferably operates in a continuous, in-line manner with rolls of materials being processed.

The first flexible conducting layer needs to have low surface roughness and must be conducting enough to be able to initiate uniform electrodeposition of the metal. In practice this means that the surface conductivity of the first layer should be most preferably less than 1 ohm/square (preferably less than 10 ohm/square, ideally less than 100 ohm/square and at least less than 1000 ohm/square).

In order to select suitable conducting carrier substrate materials, measurements were made of the surface roughness of different candidate materials. Ra is the arithmetic mean deviation of the profile.

| Material | Surface roughness (Ra) in nm | Maximum height of the roughness profile, Rz in nm | Supplier |
| --- | --- | --- | --- |
| GTS5500 (0.25)10ED, 9 um thick Cu/25 um thick PET film laminate | 366 (perpendicuar to rolling direction), 271 parallel to rolling direction. | 2280 perpendicular to rolling direction. 1710 parallel to rolling direction. | GTS Materials, Wales |
| Sputtered Nichrome/Cu on Teonex Q65FA PEN film. | 16 | 113 | CPI, Wilton, UK |
| Low roughness electrodeposited Nickel foil | 16 | 89 | Foil Technologies, Hereford, UK |

The sputtered Nichrome film and the electrodeposited Nickel foil are both suitable for use in the manufacturing process because the surface roughness is less than 20 nm and because the maximum height of the roughness profile is less than 150 nm. The optical haze of the final composite electrode is proportional to the square of the rms surface roughness and the surface roughness on the top of the composite electrode is replicated from the surface of the conducting carrier. Optical quality thin plastic films such as Melinex ST504 PET film have haze values of less than 1% and a total light transmission of more than 80%. It is for this reason that for transparent composite electrodes the rms surface roughness of the composite electrode is preferred to be in the range 5 to 30 nm, more preferred in the range 5 to 20 nm and most preferred in the range 5 nm to 15 nm.

The maximum height of the roughness profile of the conducting carrier surface must be less than the total molecular electronic device thickness, otherwise there is the chance of shorting between the top and bottom electrodes in the device. It is for this reason that the average maximum height difference of the conducting carrier and resulting composite electrode surface is preferred to be in the range 1 nm to 150 nm or in the range 5 nm to 100 nm or in the range 5 to 50 nm or in the range 5 to 25 nm, depending on the design of the molecular electronic device.

The surface of the flexible conducting layer must also be of a suitably dissimilar chemical state to the metal or metal alloy being deposited so as to ensure that the metal can later be mechanically removed without damage to either to the metal features or the conducting carrier layer. This can be achieved for example by passivation of the conducting layer prior to use or by careful selection of the metal or metal alloy type of the conducting carrier. Examples of passivation methods known in the art and which can be used are immersion in a weak solution of potassium dichromate, anodic treatment (electrolytic treatment to form an oxide at the surface of the metal), corona treatment or plasma treatment in an oxygen containing plasma. Passivation may be achieved for example by the incorporation of a small percentage of chromium in Nickel. Nichrome alloys with chromium percentage in the range 1 to 5% are most preferred (preferred 5% to 10%, also possible 10% to 20%). Other Nickel metal alloys containing the elements Cr, V, Mo, W, Co are also preferred. These alloys are conveniently deposited by means of metal sputtering for example. Other metal alloys which give a passivated surface include stainless steels of different composition (e.g. 302, 316). Self assembled organic monolayers such as thiols can be used to passify gold.

The second layer having a surface relief can be supported on a film, foil, roller or belt. When supported on film the resulting flexible moulding film can also be referred to as the "flexible dispensing layer" or "polymer shim". It can be made by the methods and materials described in U.S. Pat. No. 6,671,095. It has the essential properties that it must be non-absorbing to the method used to cure the relief forming material, it must provide good release (no sticking) from the cured relief forming material and it must be able to accurately retain the relief forming features which define the metal track pattern. The height and width of the surface relief features on the flexible moulding film determine the height and width of the features in the relief forming material and thereby the width and thickness of the metal tracks in the composite electrode. It is advantageous for the metal tracks to have a high aspect ratio (defined as the ratio of the height to the width of the track) as this gives the lowest electrical resistance and highest transparency. Preferably the aspect ratio of the metal tracks should be greater than 0.5, more preferably greater than 1 and most preferably greater than 2. Aspect ratios up to 30 or more have been reported in the literature when forming replicas by light cure embossing methods. The thickness of the resulting metal track is typically in the range 100 nm to 10 micron. Thinner electrodes are too resistive. Thicker electrodes are possible limited only by the maximum aspect ratio of surface relief features that can be made on the flexible moulding tool and dependent on being able to release the flexible moulding tool from the relief forming material without damage, pulling out or lifting effects at the desired process speed.

Pressure is applied along the line of contact by any suitable means. Suitably the pressure is applied using an advancing bar or flexible blade under a compressive load which may be drawn along the surface of the laminate, or using a roller under a compressive load which may thus on advancement or rotation retain the relief forming material in the nip formed by the bar, blade or roller between the flexible moulding film and the conducting carrier surface. The benefits of curing at the line of contact are described in U.S. Pat. No. 5,985,084 and U.S. Pat. No. 6,671,095. Another possible method of applying the pressure is by means of an air knife located a fixed distance above the surface of the flexible moulding film. The advantage of this latter method being that the pressure may vary locally across the line of contact depending on the arrangement of the surface relief on the flexible moulding film and thereby minimise the thickness of any residual layer of cured relief forming material remaining covering the conducting carrier surface after the pattern definition step.

In the first method of manufacturing the composite electrode, the relief forming material is cured by irradiating it through the flexible moulding film. A second method of manufacturing the composite electrode is to replace the flexible moulding film with an embossing roller or cylinder or belt which is transparent to the wavelength of light needed to cure the relief forming material and then curing the material using a light source placed inside the embossing roller and which irradiates the material through the walls of the roller. In another variant of this process, the light source can alternatively be placed outside of the embossing roller and irradiates the relief forming material through a transparent embossing roller.

The manufacturing processes described refer to the use of a light curing material to form the surface relief onto the conducting carrier.

Suitable relief forming materials for use as the non-conducting at least radiation curable material include optically transparent light curable resins. In particular the optically transparent relief forming material may be formed from acrylates and methacrylates such as isobornyl acrylate, polyurethane acrylate, methyl methacrylate, polyether acrylate, epoxy acrylate and mixtures thereof. Acidic acrylate monomers may also be used as one of the components of the formulation.

Suitable relief forming materials for use on the second substrate layer include for example acrylates and methacrylates such as isobornyl acrylate, polyurethane acrylate, methyl methacrylate, polyether acrylate, epoxy acrylate, Fluorine, Silicon containing acrylates and methacrylates, Polydimethylsiloxanes and mixtures thereof. Fluorine or silicon containing thermoplastics or fluorine or silicone containing thermosetting resins may also be used.

In order to facilitate curing of the resin it is preferred to use an initiator, for example, a thermal and/or photoinitiator. Typically when used, an initiator is present in the resin at a concentration from 0.1% to 3.0% by weight, and preferably from 0.5% to 2.0% by weight. Suitable photo-cationically curable epoxy resins include those sold under the trade name Cyracure, for example, 3,4expoycyclohexylmethyl-3,4-epoxycyclohexane carboxylate and bis-(3,4-epoxycyclohexyl) adipate.

However, other methods of curing the relief forming material can be used. The most preferred methods are those which give the fastest rate of cure of the material and so allow the manufacturing process to operate at the fastest speed. In addition to light curing other methods possible and known in the art include electron-beam curing, microwave curing, ultrasonic curing, ion-beam curing and thermal curing. In the case of microwave curing or ultra-sonic curing either the flexible moulding film or the embossing roller needs to be transparent (non-absorbing) at the frequency or frequencies emitted by the curing source. In case of electron beam or ion-beam curing, either the flexible moulding film or the embossing roller needs to be transparent to the electrons or ions from the curing source. In the case of a thermal curing relief forming material the heat from the source must be able to pass through to the relief forming material without significant cooling. More than one curing method can be used in combination e.g. UV curing and thermal curing.

After the embossing step used to define the surface relief pattern onto the conducting carrier, any residual non-conducting relief forming material remaining covering the conducting carrier must be removed in order to allow electrodeposition of metal into the low regions of the pattern. This is most conveniently done by using plasma etching with a gas mixture of Oxygen, Fluorine (from CF4) and Nitrogen. Isotropic or preferably anisotropic plasma etching conditions can be used. Other methods may also be employed.

These include, but are not limited to, ozone treatment, corona dischange treatment, laser ablation, ion beam bombardment and the like. Chemical means may also be used provided that the residual layer can be etched away without causing the remaining pattern to delaminate from the conducting carrier.

Deposition of metal or metal alloys into the surface relief pattern is most easily achieved by electro-deposition. The most preferred method is electrolytic plating from a bath containing the metal to be plated in the form of a suitable salt (e.g. copper sulphate). Electroless plating methods can also be used. Other electrodeposition methods can be used provided that the metal species can be created, transferred to the surface of the conducting carrier and reduced so as to deposit the metal.

Suitable transparent adhesive materials include organic oligomers with one or more functional groups such as epoxies, acrylates or methacrylates for example. The adhesive materials can be UV curing, light curing, thermal curing, pressure sensitive, hot melt or microwave curing for example. An example of a suitable hot melt thermoplastic would be an amorphous aliphatic co-polyester. Thermally reversible crosslinking based on the Diels-Alder reaction occurring between furan and maleimide functionalised formulation components are useful in providing temporary transfer of layers or control of stick and release characteristics. Polyvinyl butyral is often preferred for adhesion to glass.

The final carrier substrate is preferably a transparent thermoplastic film such as polyester (PET), polyethylenenapthalate (PEN), polycarbonate (PC), cyclic polyolefin, polyethersulphone (PES), polyetheretherketone (PEEK), polyarylate, polypropylene (PP), tricellulose acetate (TCA) and polyethylene (PE).

It is preferred that the surface roughness of the carrier substrate for the first second and third layers, is equivalent to that of the desired surface of the composite electrode. This can be achieved by planarising the film surface with a coating. It is preferred that all the wet coated layers are applied to the carrier substrate using precision coating methods under stable reel to reel film coating conditions using techniques including precision bead or slot or gravure coating or printing.

However, rigid substrates may also be used for the third substrate (also referred to as the final carrier substrate). Glass is commonly used for example.

The supporting substrate does not have to be added at the end of the process. The previously described methods of manufacturing may be modified so that, after plating but before contacting the adhesive layer, a material suitable to form the supporting substrate is deposited after the metal deposition. Then the first conducting carrier layer is removed leaving the composite electrode supported onto the deposited material. Suitable materials would be for example thermoplastics, polymers, polymer resins or pre-cursors thereof.

After transfer, some of the plated metal may be removed by chemical etching. This may be done to achieve even greater planarity of the surface or to expose an underlying metal layer for example. Also, if required by the final application, further metal may be plated onto the composite electrode after transfer, so as to provide an alternative metal surface to the composite electrode or to increase the top surface area of the electrode. The combination of etch back followed by over-plating may be used to create a surface with the required flatness and metal composition to suit the end use application.

Additional functional layers may be deposited on top of the composite electrode surface, in contact with the exposed metal and the relief forming material. These functional layers are used to create the molecular electronic devices or to create versions of the composite electrode with increased functionality. The first functional layer on top of the composite electrode should be electrically conducting. Examples of optically transparent, conducting materials which can be advantageously used as the first functional layer are for example transparent metal oxides (such as Indium Tin Oxide or Zinc Oxide or Gallium Indium Zinc Oxide or other oxides of Zn and Sn and Ga), transparent semiconducting polymers such as PEDOT:PSS or polyaniline, transparent thin crystalline films of carbon nanotubes (with or without $C_{60}$ Fullerenes), transparent thin layers of graphene or graphene-containing ink or transparent films comprising a dielectric matrix containing metal nanoparticles.

A third method of manufacturing the composite electrode provides an advantageous method for patterning the arrangement of metal tracks during manufacture so as to form an electrical circuit wiring pattern. This can most easily be accomplished by applying an additional photoresist layer on top of the second layer surface relief masking pattern, exposing the additional photoresist layer using a photomask. Developing the photoresist layer so as to create protected and unprotected regions of the underlying surface relief masking pattern. Removing at least part of the masking material so as to selectively expose the electrically conducting surface beneath the relief features only in regions unprotected by the photoresist. Removing any remaining photoresist material. Depositing a layer of a first metal selectively onto the exposed regions of the electrically conducting surface. Optionally depositing an additional layer of a second metal over the first metal. Optionally depositing an additional layer of a third metal over the second metal. Finally, transferring the second layer and all metal layers present off from the first conducting substrate and onto to a different, transparent, final supporting or functional substrate using an optically transparent adhesive material. The advantage of this method is that the photomask used to expose the resist can be easily and inexpensively changed compared to the flexible moulding film or embossing roller. In this way the flexible moulding film or embossing roller can comprise a uniform mesh-like pattern of high and low regions where the feature sizes are small (e.g. line width less than 10 micron, preferably less than 5 micron). While the photomask contains a pattern with minimum feature size above 100 micron. The resulting circuit pattern consists of conducting tracks comprising single small width wires (e.g. 5 micron wide) or interconnected sections of wire mesh formed into lines, contact pads, sensor elements, electrode contact pads etc.

Instead of a photoresist masking material, a printing method (such as screen printing, ink-jet printing, gravure printing, off-set litho printing and the like) or a physical barrier mask could used to create protected and unprotected regions of the second layer.

More complicated circuit designs can be made by designing the layout into the embossing tool. For example, a capacitive touch screen can be made using sensor lines made out of sections of grid-like pattern or with 5 micron wide electrode fingers.

Examples of advantageous designs for use with metal grids are for example; irregular or non-periodic arrangements of the metal tracks so as to minimise Moire interference effects, wavy grid shapes designed to improve the resistance of the grid film to track breaking or change in electrical properties caused by bending, flexing or heating, tapering of wires at the crossing points so as to prevent line broadening, deliberately introduced small gaps or breaks so as to affect the electrical resistance per unit length of a grid region, anisotropic grid shapes so as to create different resistance per length in different directions.

A fourth method of manufacturing the composite electrode uses a coating of a selectively soluble conducting material deposited on top of the conducting carrier before definition of the surface relief pattern. This material must be selected so that it is not attacked by the chemicals used in any of the pattern definition and metal deposition processes. It must be sufficiently electrically conducting so as to enable the electrodeposition process to take place. It must also be soluble in an organic solvent or other chemical etchant so that at the end of the process, after contacting with the adhesive and final carrier substrate, it may be dissolved or chemically etched away, thereby causing the composite electrode to be released from the surface of the first conducting carrier layer. Suitable materials for use as the release layer coating are for example carbon loaded polymers, polymers or polymer resins loaded with metallic nanoparticles or thin metal layers such as silver.

Embodiments of the present invention will now be described, by way of example only, and with reference to the accompanying drawings of which:

Figure 4A:
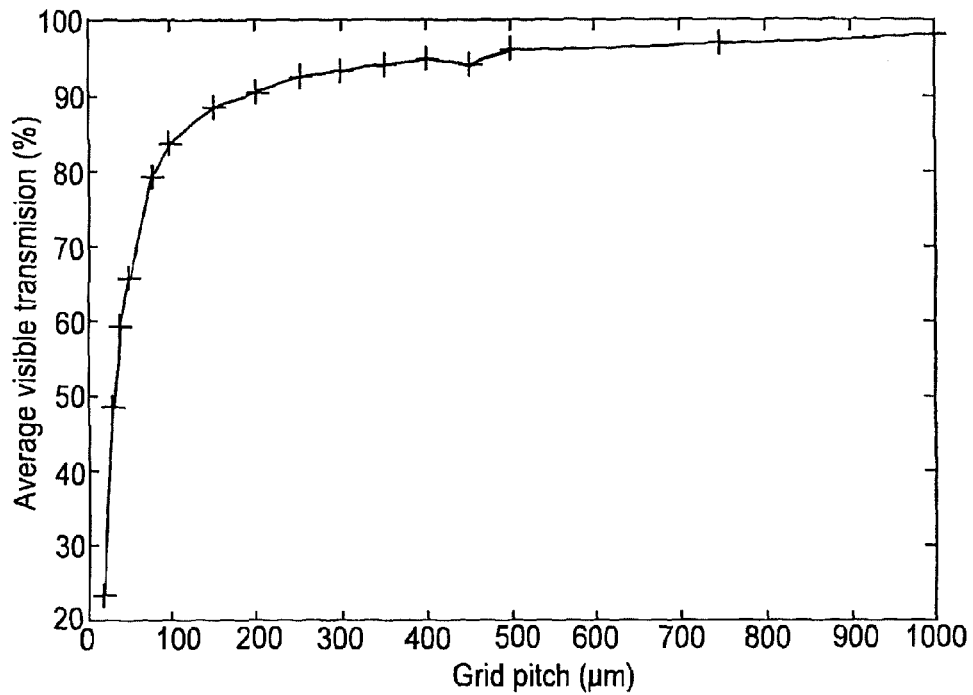
Figure 4B:
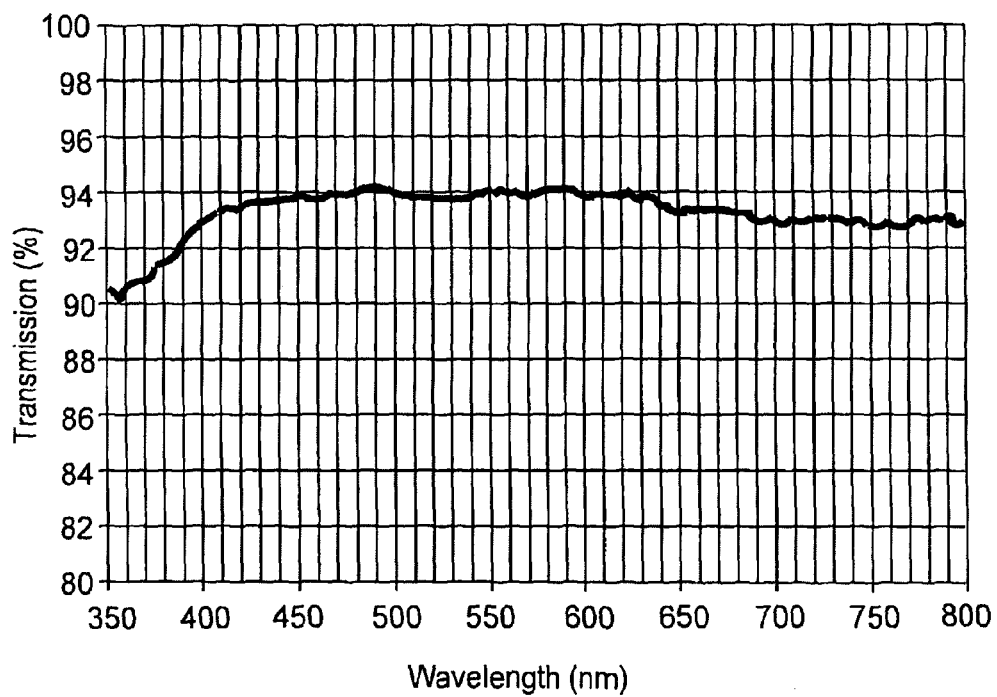
Figure 5A:
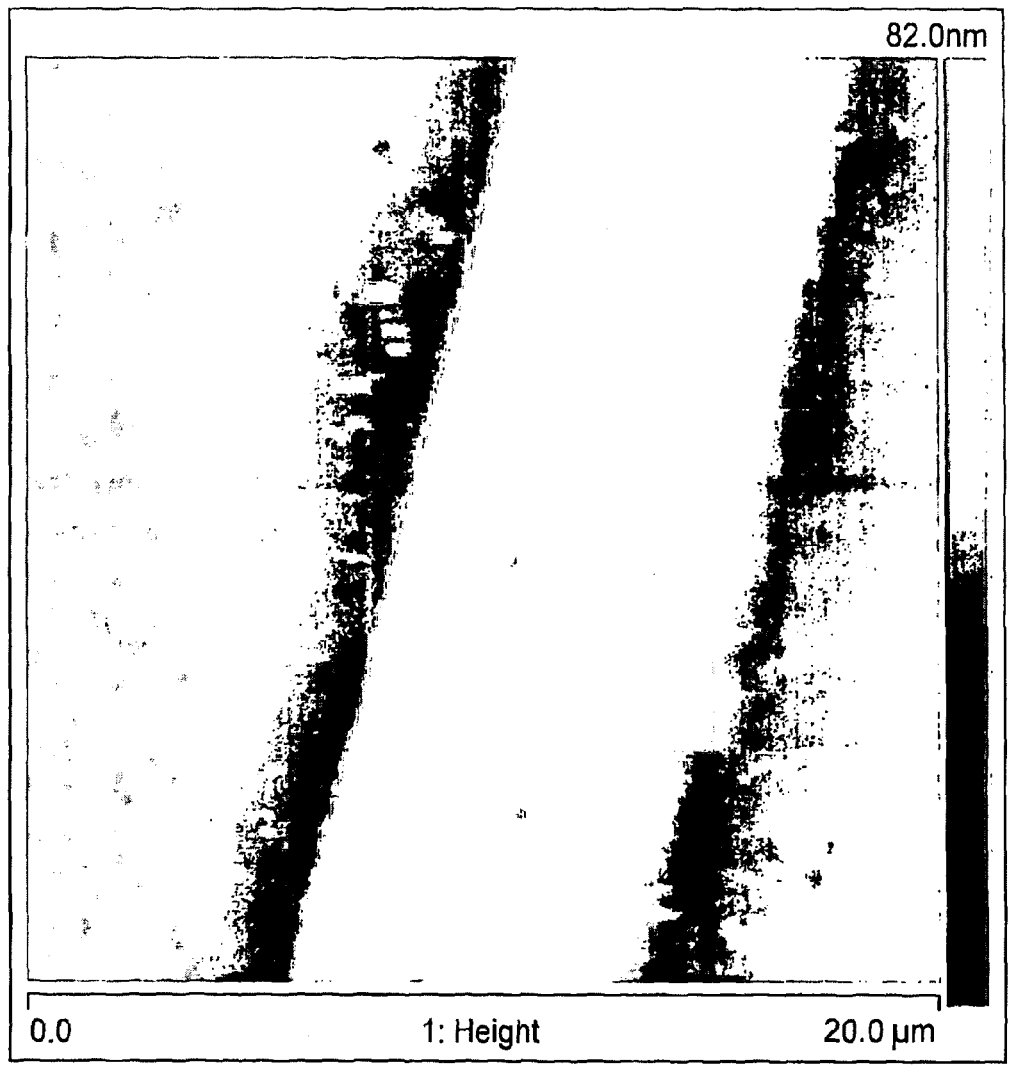
Figure 5B:
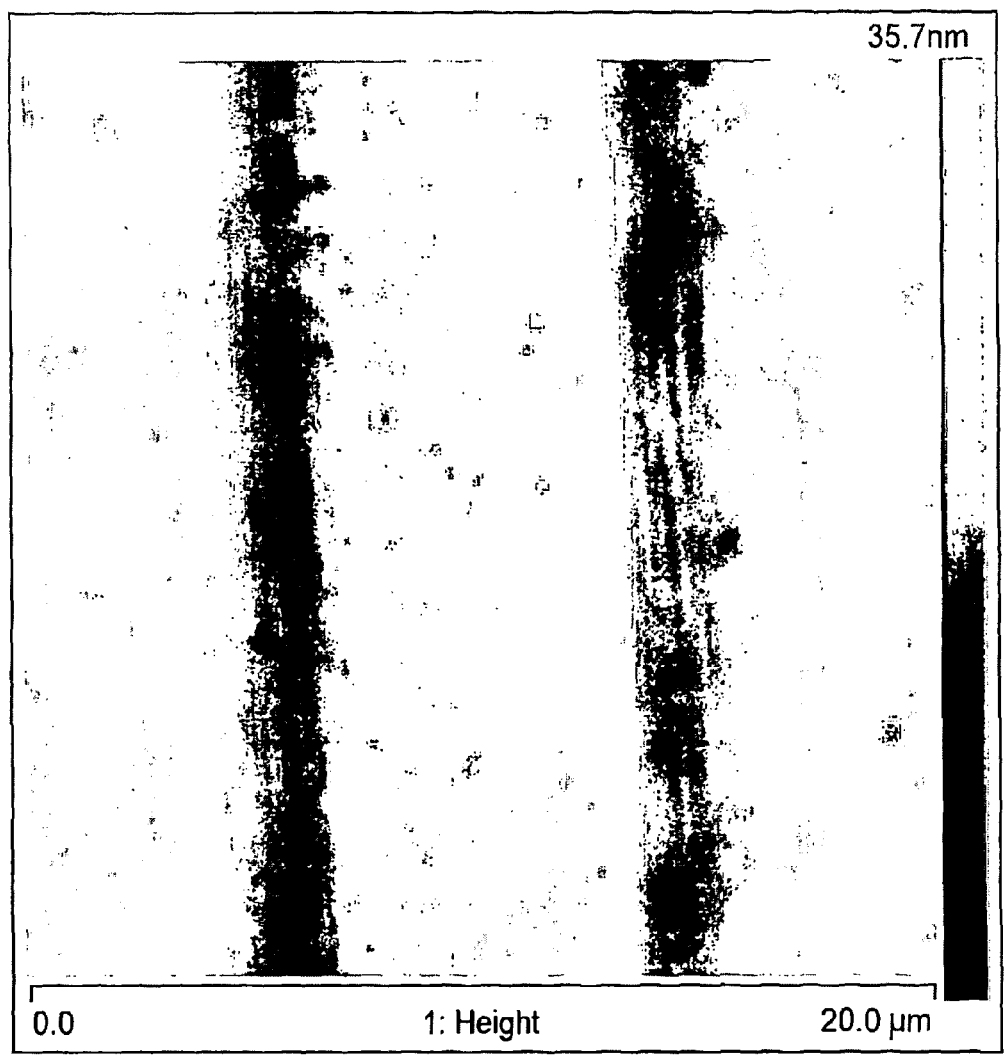
Figure 6:
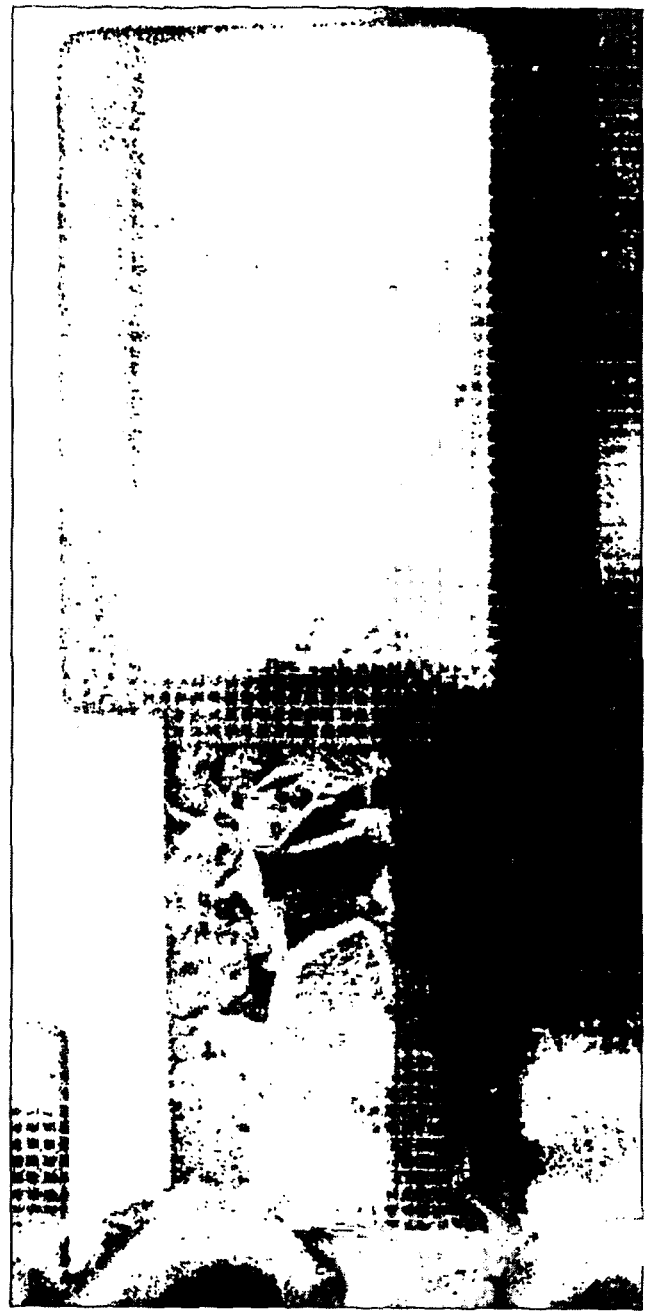
Figure 7A:
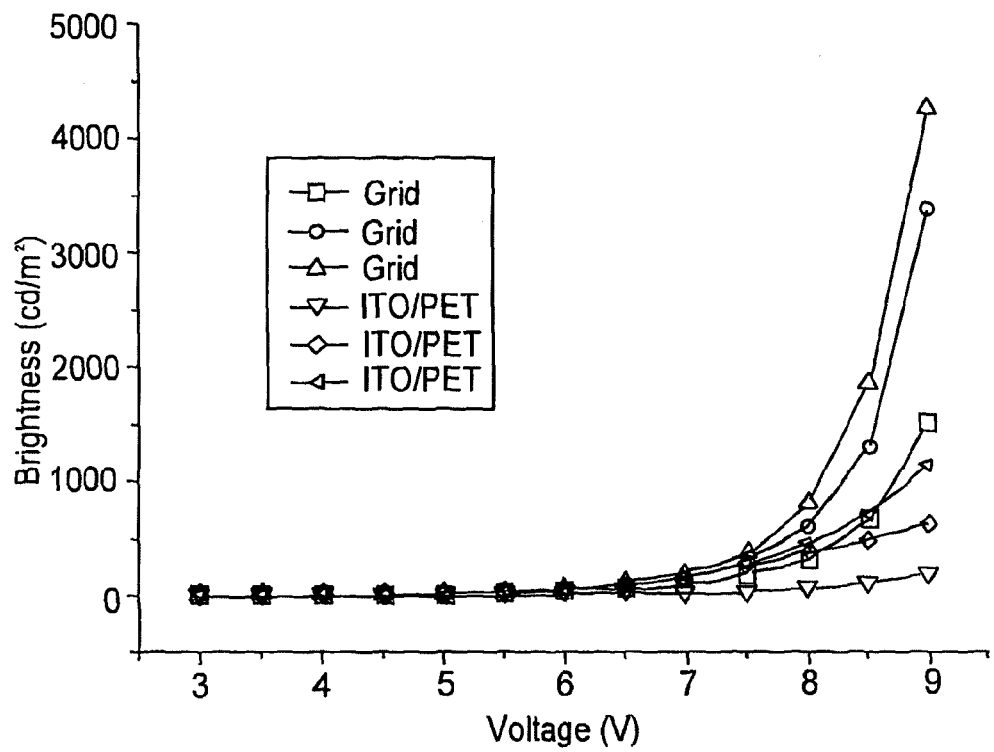
Figure 7B:
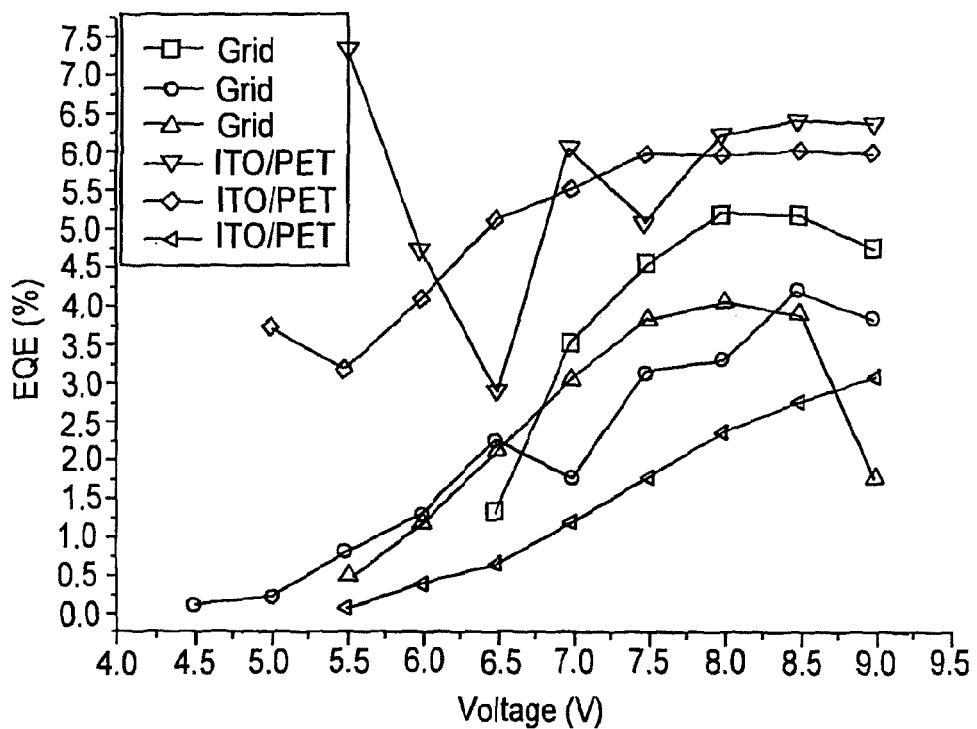
Figure 7C:
Figure 8A:
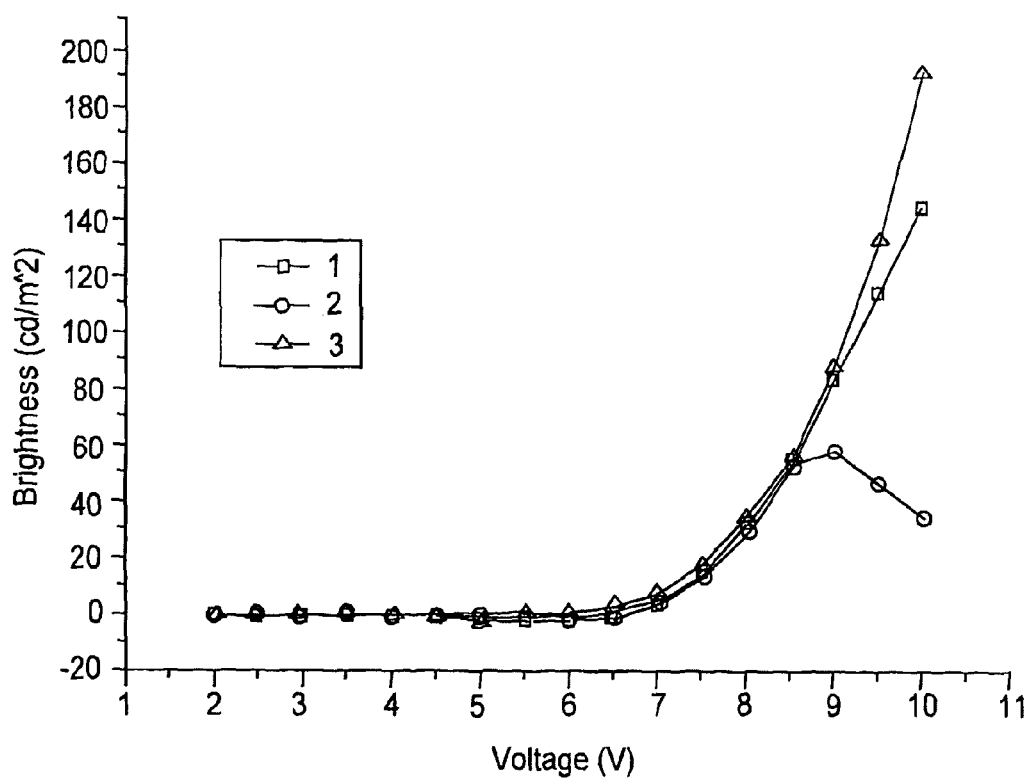
Figure 8B:
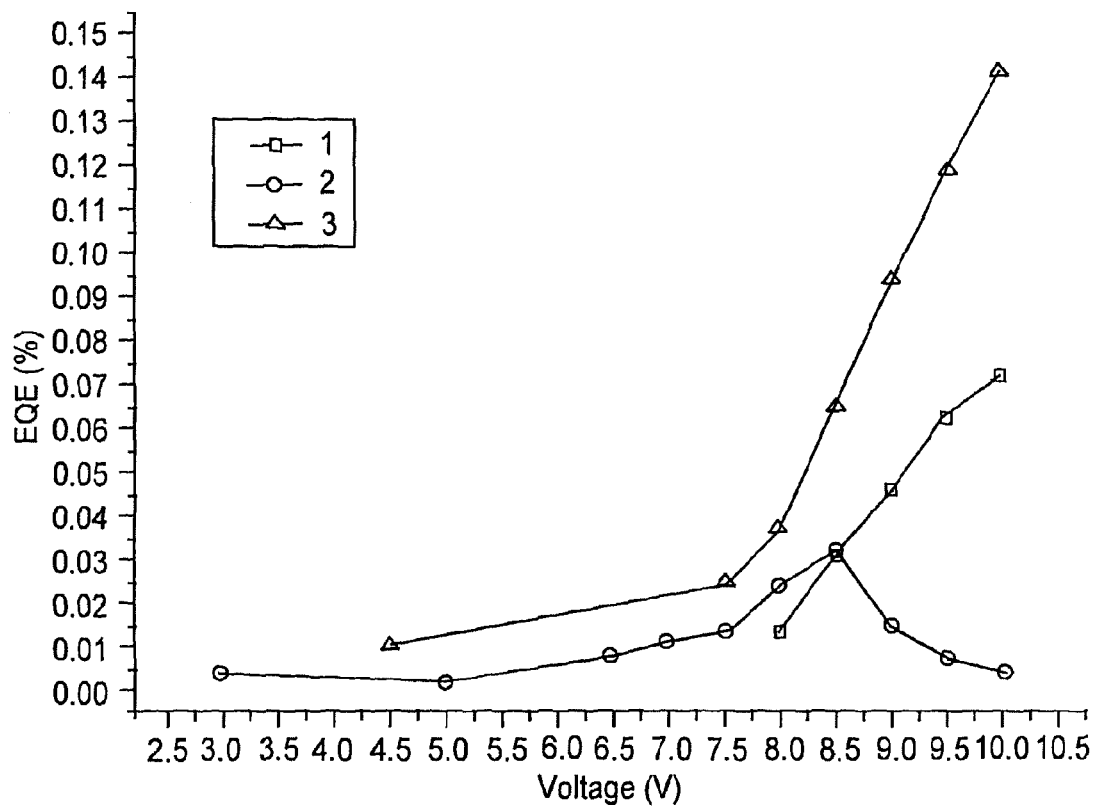
Figure 9:
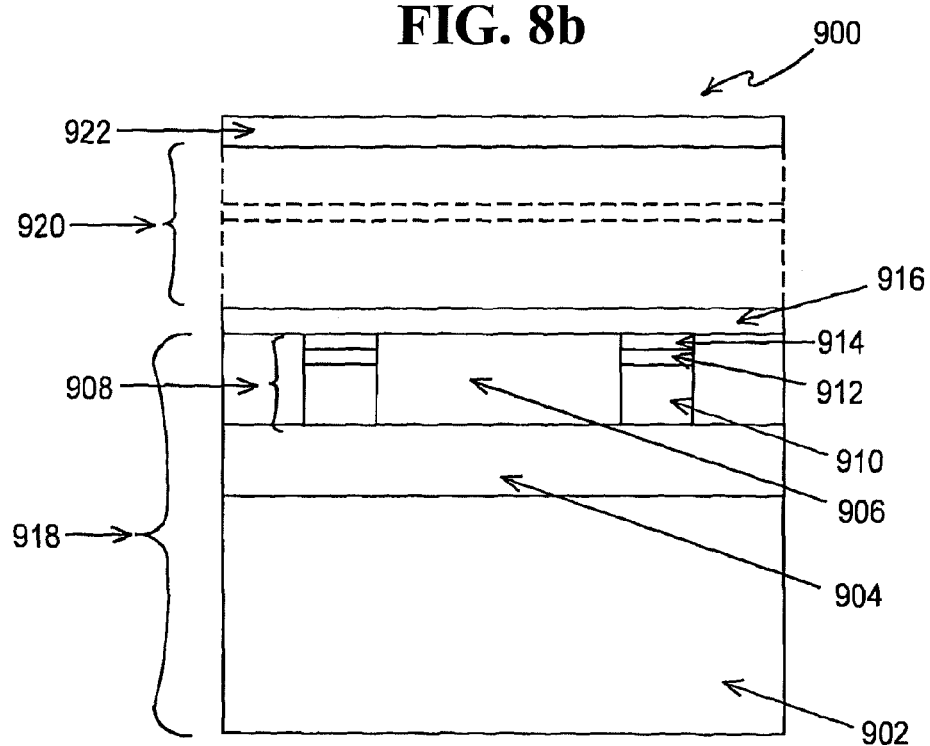
Figure 10:
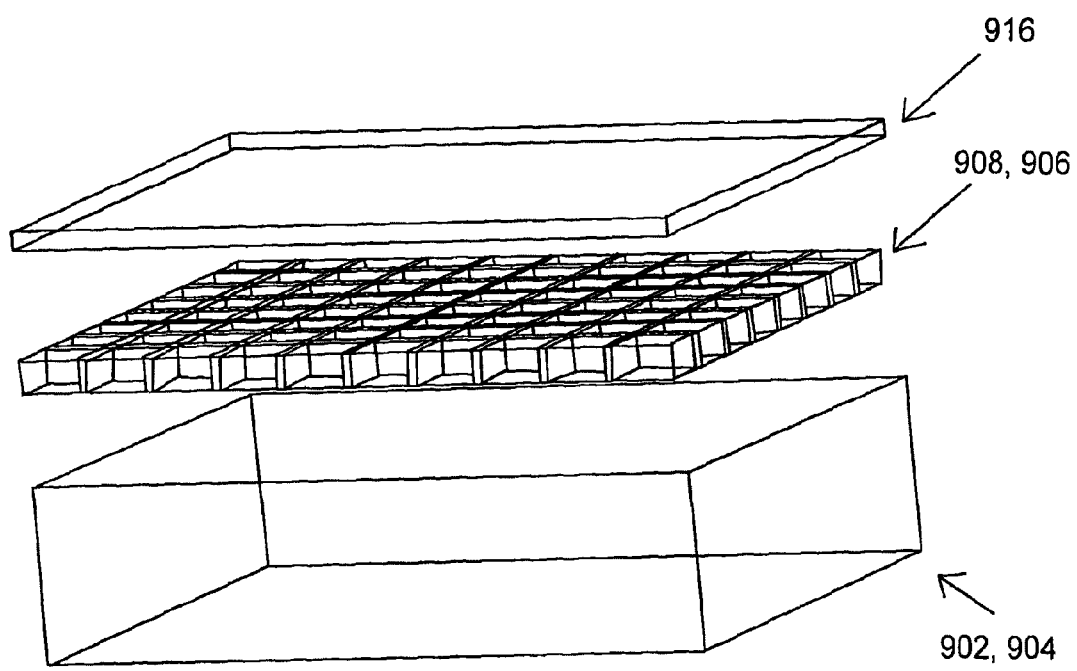
Figure 11:
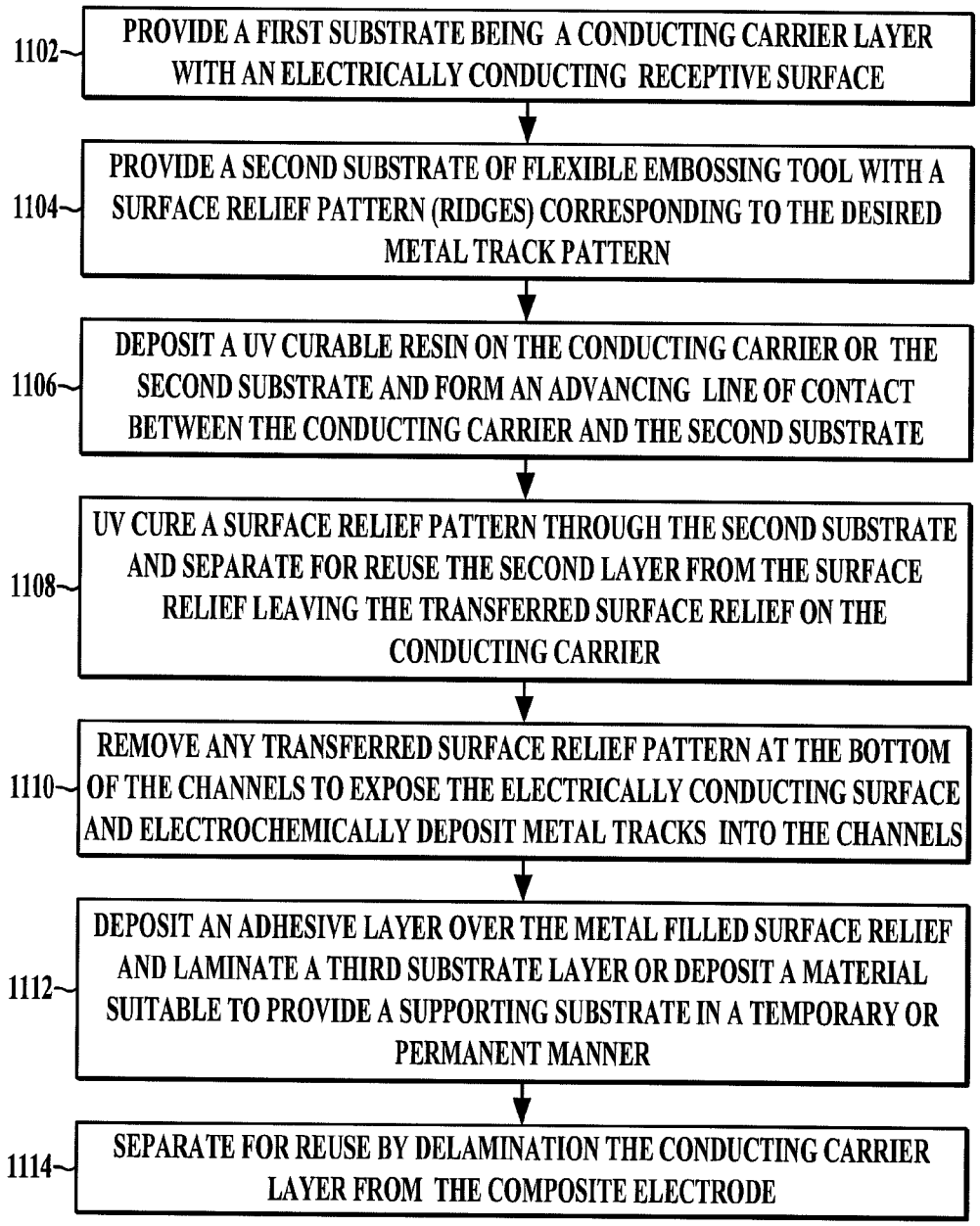
Figure 12:
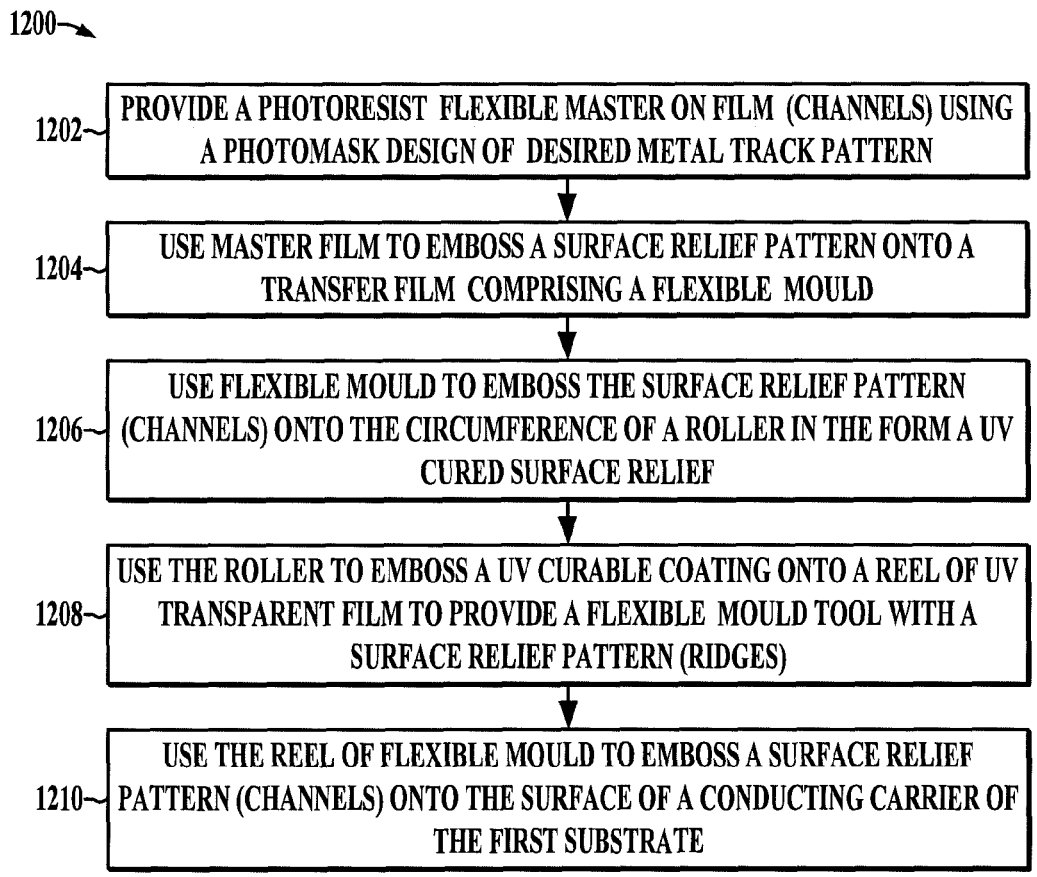
Figure 13:
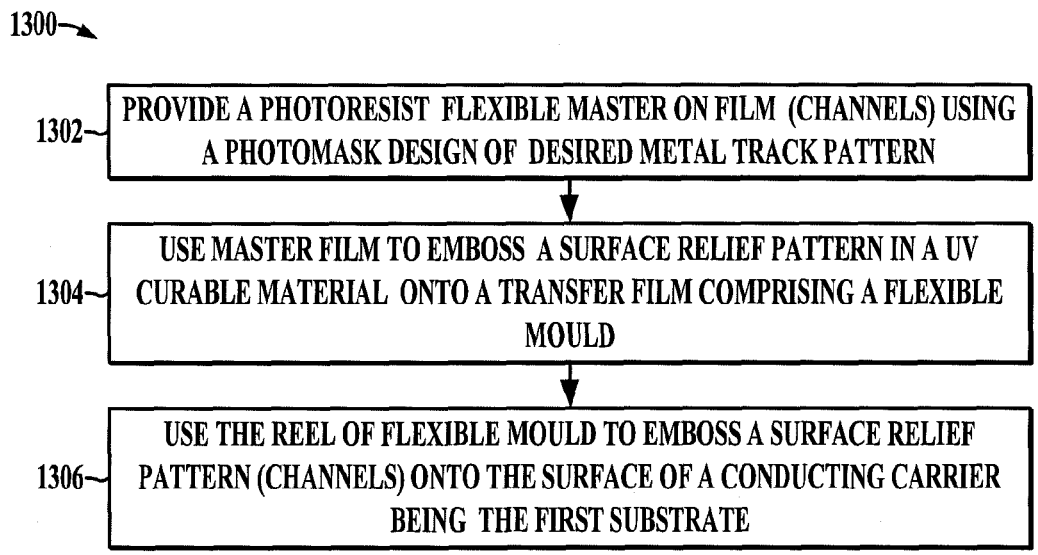
Figure 14:
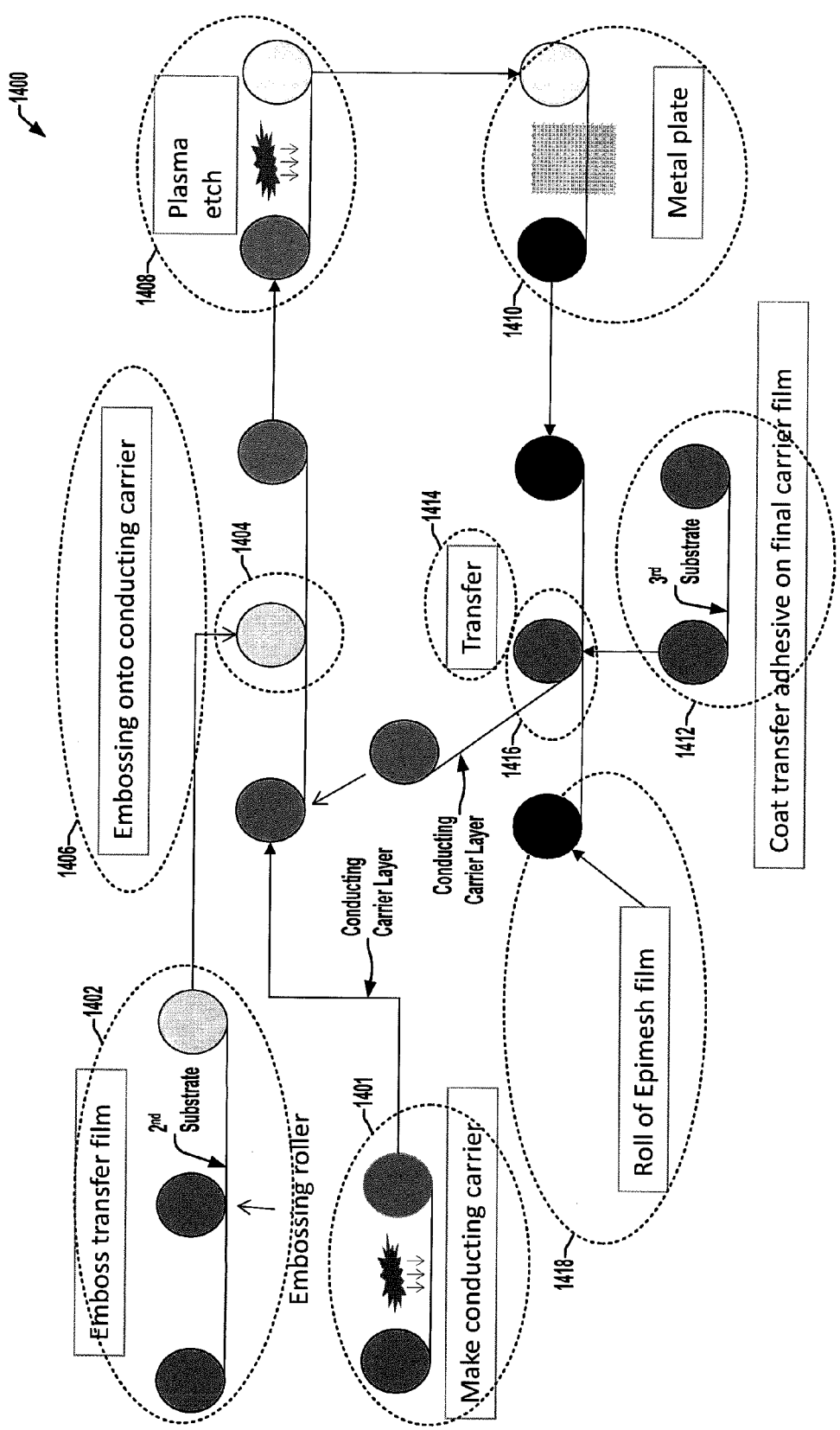
Figure 15:

FIG. 4a is a graph of experimentally measured optical transmission vs grid pitch for composite electrodes manufactured according to example 1 with 6 micron wide Nickel tracks with transmission averaged between 400 and 700 nm;

FIG. 4b is the measured optical transmission spectrum for a 300 micron pitch square packed Nickel composite electrode manufactured according to example 1 with 6 micron wide tracks;

FIG. 5a is an AFM image of the surface of a composite electrode manufactured according to example 4;

FIG. 5b is an AFM image of the surface of a composite electrode from example 4 after PEDOT coating;

FIG. 6 shows a photo of the emission of light from the OLED device according to example 5;

FIG. 7a is a graph of brightness vs voltage applied for devices according to example 6;

FIG. 7b is a graph of external quantum efficiency vs voltage of devices according to example 6;

FIG. 7c is a photo of an OLED device according to example 6 with uniform light emission across the device;

FIG. 8a is a graph of brightness as a function of applied voltage for a polymer OLED device according to example 7;

FIG. 8b is a graph of external quantum efficiency as a function of applied voltage for the polymer OLED devices according to example 7;

FIG. 9 is a cross-section of an OLED or PV device according to embodiments of the present invention; and FIG. 10 is an exploded view of a composite electrode according to embodiments of the present invention;

FIG. 11 is a flow diagram illustrating an exemplary method for manufacturing a composite electrode in accordance with one or more aspects of the present disclosure;

FIG. 12 is a flow diagram illustrating one embodiment of a process for providing a surface relief pattern on a conducting carrier of a first substrate;

FIG. 13 is a flow diagram illustrating a second embodiment of a process for providing a surface relief pattern on a conducting carrier of a first substrate;

FIG. 14 is a partial schematic system diagram showing an overall process for manufacturing a composite electrode in accordance with one or more aspects of the present disclosure; and FIGS. 15-22 illustrate an embodiment of a composite electrode undergoing manufacturing generally in accordance with the process of FIG. 11.

EXAMPLES

Commercially available radiation curable materials are used to exemplify the invention as detailed below.
Formulation A
Ebecryl 285, urethane acrylate (Cytec)
Hexane diol diacrylate, (Sartomer 238)
Ebecryl 350, silcone diacrylate (Cytec)
Gencure BDK, photoinitiator (Rahn)
Gencure DMHA, photoinitiator (Rahn)
Formulation B
Isobornyl acrylate (Cytec),
CN104D80, epoxy acrylate (Sartomer),
Ebecryl 639, epoxy acrylate (Cytec),
Gencure BDK, photoinitiator (Rahn),
Gencure DMHA photoinitiator (Rahn),
Preparation of adhesives (Formulations C and D)
Formulation C
EPON SU8, epoxy novalak (Miller Stephenson Inc),
Polyol 3610, alkoxylated polyol (Perstop),
Cyracure UVI-6976, mixed triaryl sulphonium hexafluoro antimonate salt (Dow Chemicals),
Formulation D
Cyracure UVR 6128, cycloaliphatic epoxide (Dow Chemicals),
Polyol 3610, alkoxylated polyol (Perstop),
EPON SU8, epoxy novalak (Miller Stephenson Inc),
Cyracure UVI-6976, mixed triaryl sulphonium hexafluoro antimonate salt (Dow Chemicals), Example 1

A master grid-type surface relief pattern of channels, each 5 micron wide and 5 micron deep was made in an epoxy-type photoresist (SU8 3050, MicroChem Corp, USA) spin coated onto 125 micron thick PEN film (Du-Pont Tejin Teonex grade Q64 FA), soft baked for 2 min at 95° C., exposed by UV hard contact exposure with 45 mJ/cm2 through a chrome on glass photomask followed by post exposure bake for 3 mins at 95° C., development in SU8 developer solution at room temperature for 4 mins and a rinse in Isopropylalcohol. The grid pitch was 200 micron, square packed. The SU8 film master was mounted flat onto the bed of machine with the pattern side on top. An excess of Formulation A at 100% solids was applied to the surface of a 125 micron thick polyester substrate (Du-Pont Tejin Films, Melinex gradeST 505). This material was formulated to give a built-in release property. The polyester substrate was then roll laminated to the surface of the SU8 master film using a 400 mm diameter rubber faced roller so that the UV curable resin formulation completely filled the surface relief structure on the SU8 master film. The nip load used was 2 bar. The speed of lamination was 2 cm/s. On exiting the nip, UV curable resin was immediately fully UV cured whilst still in contact with the SU8 surface using an ultra-violet lamp system (GEW, Surrey, UK) delivering 300 W/inch of power. After lamination, the two film substrates were peeled apart at the interface between the SU8 and the UV cured resin. The resulting film with UV cured resin surface relief is referred to as the "polymer shim". Using the polymer shim as a UV transparent mould tool and with the same process conditions as before, the grid surface relief pattern was then replicated a second time onto a highly planar mirror-finish conducting film carrier (Nichrome over copper sputtered PET, 0.4 ohm/square surface conductivity, <20 nm average surface roughness) using Formulation B. The conducting carrier was placed in an oxygen plasma etch (Plasma Etch Inc, PE-200) at 300 W RF power at 13.6 MHz, 50 cc/min of oxygen, 225 mTorr chamber pressure, for 20 min in order to remove any residual layer of cured resin from the low parts of the embossed pattern; thereby exposing the underlying conducting carrier. The plasma treated sample was placed first into a gold electrolytic plating bath (Aural 292, Rohm & Haas) as the cathode and plated at 0.5 A/dm$^2$ DC for 0.5 min so as to form a continuous initial gold layer of thickness >100 nm on the surface of the exposed conducting carrier. The sample was rinsed in deionised water at room temperature for 2 mins. Then the sample was plated for 5 min in an electrolytic Nickel sulphamate electro-plating bath (Nickal PC-8, Rohm&Haas,) in contact with the cathode bar. Nickel was plated onto the exposed gold plated regions until a minimum of 5 micron of Nickel was deposited (3.0 A/dm$^2$ DC for 8 min). The sample was removed from the plating bath and then rinsed for 5 mins in deionised water at room temperature followed by 10 mins in hot town water at 60° C. After rinsing and drying, the plated surface of the sample was hot roll laminated at 80° C. and 25 cm/min against a 10 micron thick adhesive (Formulation C) coated onto PET film (125 micron thick, DuPont Tejin Melinex ST505). The resulting laminate was UV cured by passing it 4 times under a 300 W/linear inch i-line UV lamp (H Bulb) at 2 cm/s and then baked for 30 mins at 80° C. The conducting carrier film was peeled off, leaving behind the adhesive-coated PET carrier film with conducting Nickel tracks embedded in the formulation B cured photopolymer resin dielectric matrix with highly planar surface. This is referred to as the composite electrode.

Example 2

Figure 1:
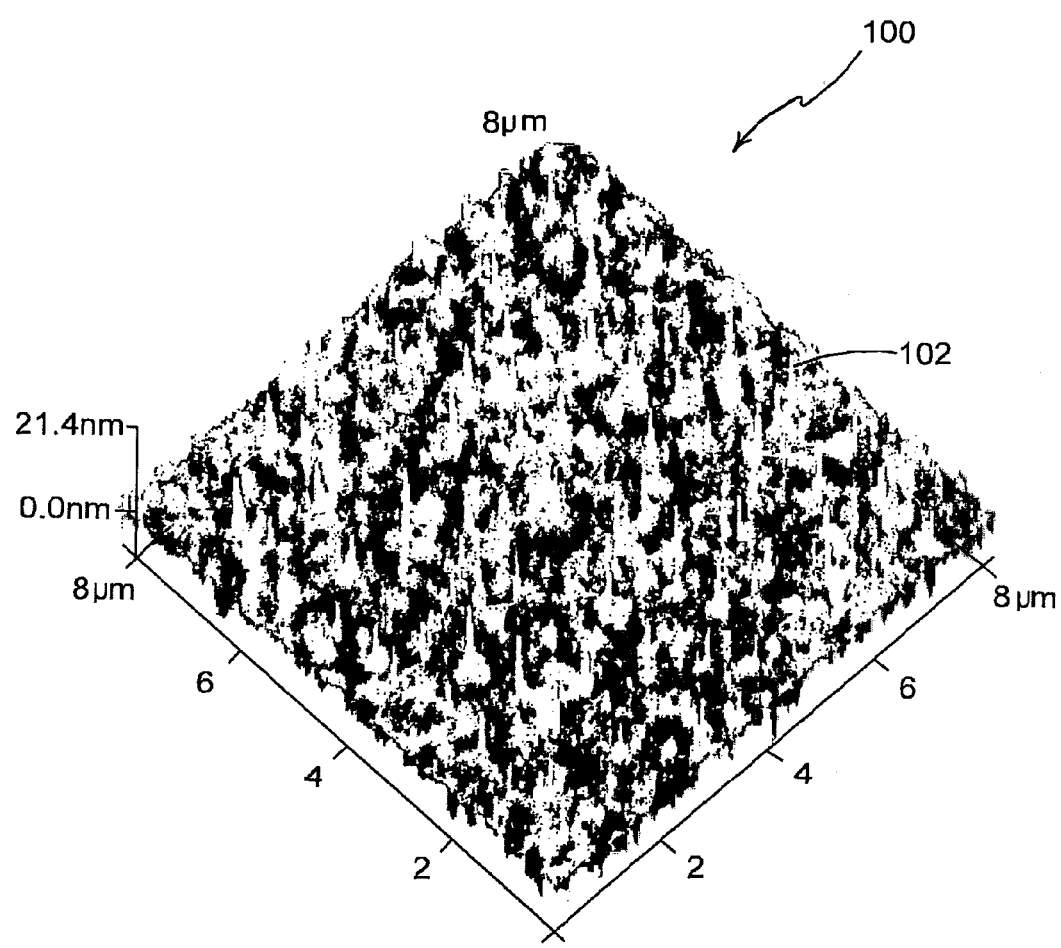
FIG. 1 is an Atomic Force Microscope (AFM) image of the surface of a 60 ohm per square sputtered ITO film.
Figure 2:
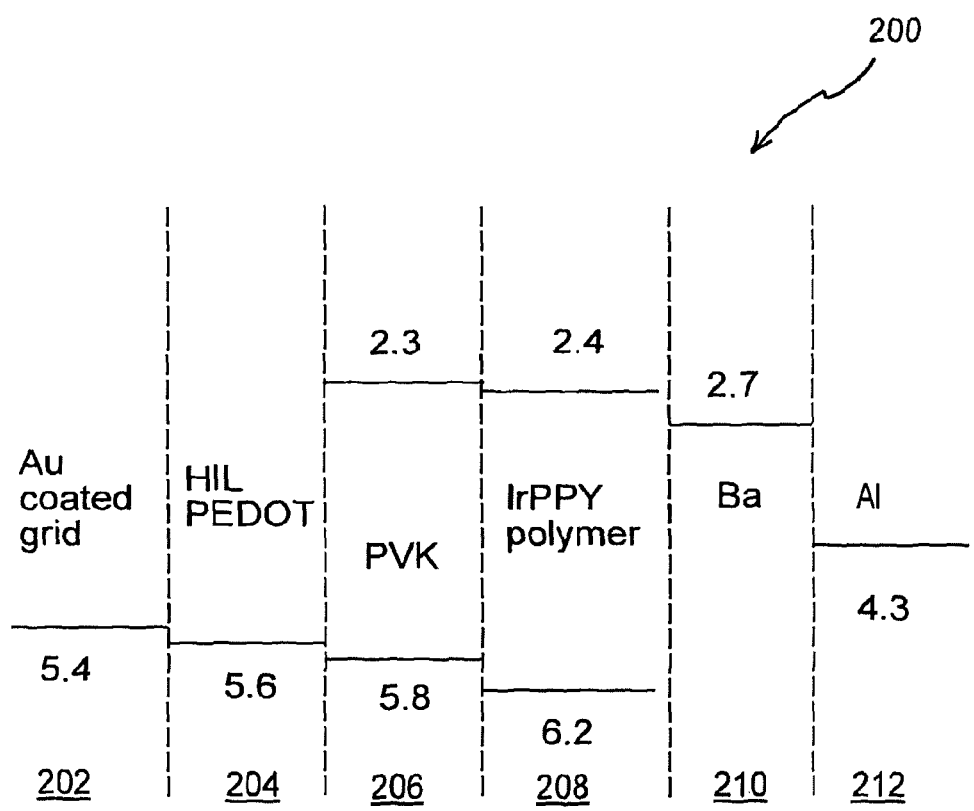
FIG. 2 is an energy level diagram of an OLED device.
Figure 3:
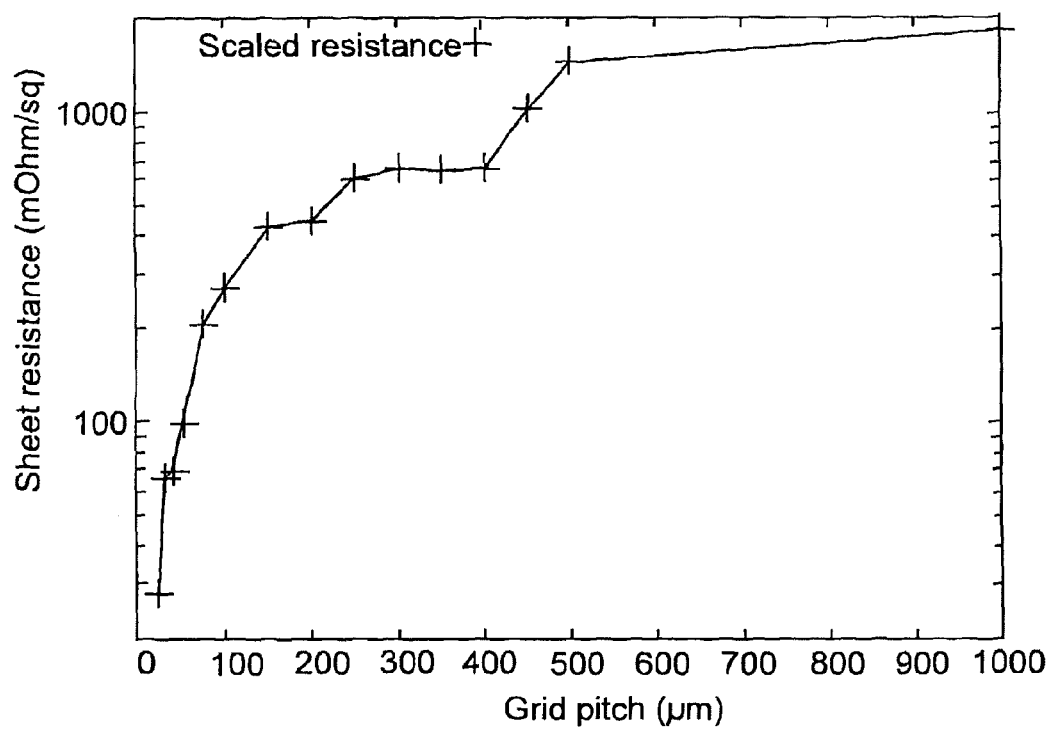
FIG. 3 is a graph of experimentally measured sheet resistance vs grid pitch for composite electrodes manufactured according to example 1 with 6 micron wide Nickel tracks.

Three composite electrode samples were made by the method of Example 1. Each sample contained regions with nickel grids of wire width 6 micron but different pitch. The sheet resistance and the average visible light transmission were measured for each different pitch grid. The results are shown in FIGS. 3, 4a and 4b. The sheet resistance has been scaled to account for slight differences in the measured metal thickness between the 3 samples. It can be seen that the surface resistivity of the composite electrode films with optical transparency greater than 80% is typically in the range 1 to 0.1 ohm per square. This is about 100 times less than the ITO equivalent film. At 90% transparency, surface resistivity is 0.27 ohm per square for a 5 micron wide, 4 micron thick Ni mesh. This compares to 8 ohm per square for ITO (deposited by remote high density magnetron sputtering) and 170 ohm/square for Clevios PH500 (PEDOT:PSS transparent conducting polymer, H C Stark).

Example 3

A sheet of Nichrome over copper sputter-coated PET film (125 micron thick, Du-Pont Tejin Films, Melinex ST505) was coated with a layer of conducting polymer resin (LOR30B, MicroChem Corp, Newton, Mass., USA mixed with silica coated and surface treated carbon black particles (Cabot M9865)). All coatings were carried out using a red k-bar (12 µm wet coat) and baked for 30 min @ 130° C. to dry. Dry coat thickness was 1.25 µm. Surface resistance of Nichrome film after coating was measured to be 5.7Ω per square. Average surface roughness on the coated film was measured to be 26+/−1 nm across direction of coating and 34+/−4 nm along direction of coating. A square grid pattern of pitch 300 micron and wire width 5 micron was embossed on top of the conducting carrier film using one of the polymer shim films produced in Example 1. The sample was plasma etched for 1 min at 300 W at 13.6 MHz with 50 cc/min Oxygen (Plasma Etch Inc, PE-200 plamsa etching machine). Nickel was plated onto the exposed conducting polymer regions until a minimum of 5 micron of Nickel was deposited (3.0 A/dm$^2$ DC for 8 min). The sample was removed from the plating bath and then rinsed for 5 mins in deionised water followed by 10 mins in hot town water at 60° C.

A PET film (125 micron thick, DuPont Tejin Melinex ST505) was coated with Formulation D and dried at 80° C. for 20 mins in an oven. After rinsing and drying, the plated surface of the sample was hot roll laminated at 80° C. and 25 cm/min against the Formulation D adhesive coated onto PET film. The resulting laminate was UV cured by passing it 4 times under a 300 W/linear inch i-line UV lamp (H Bulb) at 2 cm/s. After UV cure, the sample was post baked at 140° C. for 30 mins in an oven. After cooling, the sample was immersed in a bath of Microposit MF26A developer solution (Chestech, UK) at room temperature and the carrier substrate removed by peeling apart as the conducting polymer layer was dissolved by the developer solution, leaving behind the adhesive-coated PET carrier film with conducting Nickel tracks embedded in the formulation B cured photopolymer resin dielectric matrix with highly planar surface.

Example 4

Gold over Nickel composite electrode films with a square packed grid pattern, pitch 200 micron and line width of 5 micron were prepared by the method of Example 1. OLED devices were fabricated onto highly planar gold over Nickel composite anode electrodes. The composite electrode films were cleaned by agitation in isopropanol and deionised water, followed by 30*s* treatment with an oxygen plasma at 50 W power. The surface of the sample was analysed by atomic force microscopy (AFM). The results are shown in FIG. 5*a*. The metal track protruded ~25 nm from the surface. The RMS roughness of the top of the metal track was 5.0 nm. The RMS roughness of the regions surrounding the metal track was 5.4 nm. PEDOT:PSS (Clevios PVP CH 8000, H C Stark) was coated by spin coating. After coating, the substrates were baked at 140° C. for 20 minutes to drive off residual solvents. The dry PEDOT:PSS coating thickness was measured to be 150 nm. The surface of the PEDOT coated composite electrode film was tested again by AFM. See FIG. 5*b*. The step height across the metal lines was reduced to less than 10 nm. The RMS roughness of region on the top of the metal track was measured to be 3.5 nm and the RMS roughness of surrounding region to be 2.0 nm. The overall RMS roughness reduced from 20.6 nm before PEDOT coating to 7.2 nm after PEDOT coating.

Example 5

Gold over Nickel composite electrode films with square packed grid pattern, pitch 200 micron and line width of 5 micron were prepared by the method of Example 1. The films were cleaned by agitation in isopropanol and deionised water, followed by 30 sec treatment with an air plasma. PEDOT was coated by spin coating.

Gold-Nickel composite electrode films with a square packed grid pattern, pitch 250 micron and line width of 5 micron were prepared by the method of Example 1. OLED devices were fabricated onto highly planar gold over Nickel composite anode electrodes. The composite electrode films were cleaned by agitation in isopropanol and deionised water, followed by 30 sec treatment with an oxygen plasma. PEDOT:PSS (Baytron CPP105D, H C Stark) was coated by bar coating. After coating, the substrates were baked at 140° C. for 20 minutes to drive off residual solvents. After PEDOT coating, the sample was treated using an air plasma for 3 min. All the subsequent layers were deposited at high vacuum (below 4×10-7 mbar) in the following order: 40 nm N,N'-di-1-naphthaleyl-N,N'-diphenyl-1,1'-biphenyl-4,4'-diamine (NPD); 20 nm 4,4-N,N-dicarbazole-biphenyl (CBP) host, doped with 6% Irppy3-facl tris(2-phenylpyridine) iridium-phosphorescent dopant; 6 nm bathocuproine (BCP) hole blocking layer; 80 nm tris (8-hydroxyquinolinate) aluminium (Alq3); FIG. 6 shows a photo of the emission of light from the sample. The effect of having too high a resistivity for the conducting polymer layer can be clearly seen. Light emission from parts of the device on top of or immediately adjacent to the metal tracks is bright but the light emission from the regions further away from the metal tracks is less bright.

Example 6

Gold over Nickel composite electrode films with a square packed grid pattern, pitch 200 micron and line width of 5 micron were prepared by the method of Example 1. OLED devices were fabricated onto highly planar Gold over Nickel composite anode electrodes and onto ITO coated glass for comparison. The grid films were cleaned by agitation in isopropanol and deionised water, followed by 30 sec treatment with an air plasma. PEDOT was coated by spin coating. A PEDOT formulation of 85% Clevios PH510, 5% DMSO, and 10% ethanol was used. After spin-coating, the substrates were baked on a hotplate at 140° C. for 20 minutes to drive off residual solvents. After PEDOT coating, all the subsequent layers were deposited at high vacuum (below 4×10-7 mbar) in the following order: 50 nm N,N'-di-1-naphthaleyl-N,N'-diphenyl-1,1'-biphenyl-4,4'-diamine (NPD); 20 nm 4,4-N,N-dicarbazole-biphenyl (CBP) host, doped with 4% Irppy3-facl tris(2-phenylpyridine) iridium-phosphorescent dopant; 10 nm bathocuproine (BCP) hole blocking layer; 40 nm tris (8-hydroxyquinolinate) aluminium (Alq3); 0.8 nm LiF; 100 nm Al. FIGS. 7*a* and 7*b* show the brightness-voltage and external quantum efficiency-voltage (EQE) response curves of the devices made. It can be seen that the composite electrode grid film produces a brighter device than the ITO electrode device and had EQE in the range between 2.5% and 4.5%, only slightly lower than that of the ITO devices. This is most likely due to the structure being optimised for ITO; the incorporation of the PEDOT layer on the grid film will alter the optimal cavity structure. A photo of the uniform light emission from the device is shown in FIG. 7*c*.

Example 7

Gold over Nickel composite electrode films with a square packed grid pattern, pitch 200 micron and line width of 5 micron were prepared by the method of Example 1. OLED devices were fabricated onto highly planar gold over Nickel composite anode electrodes. The pLED structure used was based on low molecular weight (90 k) poly(vinylcarbazole) (PVKL), blended with an electron transporting material 2-(4-biphenylyl)-5-. (4-tert-butylphenyl)-17 3, Coxadiazole (PBD) and a phosphorescent green emitter facl tris(2-phenylpyridine) iridium (Ir(ppy)3); combined with an interlayer consisting of a high (1.1M) molecular weight PVK (PVKH). The pLED devices were fabricated by spin-coating a layer of PEDOT:PSS (Signa Aldrich) to act as a hole injector, followed by baking at 140° C. for 20 minutes on a hotplate. The interlayer was spin-coated from a 5 mg/ml chlorobenzene solution followed by baking at 120° C. for 10 minutes. The light emitting polymer (LEP) blend was spin-coated from a 12 mg/ml toluene solution followed by baking at 120° C. for 10 minutes. Cathodes consisting of a thin (~1 nm) NaF layer and 100 nm aluminium were thermally evaporated. A ratio of 100:40:8 PVKL:PBD:Ir(ppy)3 was used for the light emitting polymer layer. FIG. 8a illustrates brightness as a function of applied voltage for the polymer OLED device of example 7 and FIG. 8b illustrates external quantum efficiency as a function of applied voltage for three of the polymer OLED devices of example 7 made using the composite electrode.

Referring to FIG. 9, an electro-optic device 900 according to an embodiment of the present invention comprises a transparent glass substrate 902 having an adhesive layer 904 over the substrate 902. A transparent embedding dielectric 906 is deposited on the adhesive layer 904 and embeds conducting metal tracks 908. The conducting metal tracks comprise three layers 910, 912 and 914 stacked over each other within the dielectric. The first layer 910 is copper, the second layer 912 is nickel and the third layer 914 is gold. The substrate 902, adhesive layer 904, metal tracks 908 and dielectric 906 together provide a composite electrode 918. The gold layer 914 contacts a transparent conducting layer 916 of PEDOT:PSS deposited over the composite electrode 918.

Active layers 920 are stacked over the transparent conducting layer 916 and a cathode layer 922 is deposited over the active layers. In organic light emitting devices, the active layers can be an emissive polymer or small molecule and in an photovoltaic device, the active layers are a photoactive layer responsible for absorbing photons and generating electrical charges.

Referring to FIG. 10, an embodiment of the present invention comprises an exploded view of a composite electrode 918 comprising substrate 902 including adhesive layer 904 (not shown separately in FIG. 10). Metal tracks 908 are in the form of a wire mesh embedded within the dielectric layer 906 (dielectric layer 906 removed for clarity from FIG. 10). The conducting layer 916 is deposited over the metal tracks 908.

It will be appreciated that although only particular embodiments of the invention have been described in detail, various modifications and improvements can be made by a person skilled in the art without departing from the scope of the present invention.

Example 8

A master grid-type surface relief pattern of channels, each 5 micron wide (tapering to 3 micron wide at crossing points) and 4 micron deep was made in an epoxy-type photoresist (SU8 3050, MicroChem Corp, USA) spin coated onto 125 micron thick PEN film (Du-Pont Tejin Teonex grade Q65 FA), soft baked for 2 min at 95° C., exposed by UV hard contact exposure with 45 mJ/cm2 through a chrome on glass photomask followed by post exposure bake for 3 mins at 95° C., development in SU8 developer solution at room temperature for 4 mins and a rinse in Isopropylalcohol. The grid pitch was 300 micron, square packed. The SU8 film master was mounted flat onto the bed of machine with the pattern side on top. An excess of Formulation A at 100% solids was applied to the surface of a 125 micron thick polyester substrate (DuPont Tejin Films, Melinex grade ST505). This material was formulated to give a built-in release property. The polyester substrate was then roll laminated to the surface of the SU8 master film using a 400 mm diameter rubber faced roller so that the UV curable resin formulation completely filled the surface relief structure on the SU8 master film. The nip load used was 2 bar. The speed of lamination was 2 cm/s. On exiting the nip, UV curable resin was immediately fully UV cured whilst still in contact with the SU8 surface using an ultra-violet lamp system (GEW, Surrey, UK) delivering 300 W/inch of power. After lamination, the two film substrates were peeled apart at the interface between the SU8 and the UV cured resin. Using the polymer shim as a UV transparent mould tool and with the same process conditions as before, the grid surface relief pattern was then replicated a second time onto a highly planar mirror-finish conducting film carrier (Nichrome over copper sputtered PET, 0.4 ohm/square surface conductivity, <20 nm average surface roughness) using Formulation B. The conducting carrier was placed in an oxygen plasma etch (Plasma Etch Inc, PE-200) at 300 W RF power at 13.6 MHz, 50 cc/min of oxygen, 225 mTorr chamber pressure, for 20 min in order to remove any residual layer of cured resin from the low parts of the embossed pattern; thereby exposing the underlying conducting carrier. The plamsa treated sample was placed into a Cobalt Tungsten electrolytic plating bath (containing sodium tungstate and cobalt sulfate, supplied by TNO Science and Industry, Eindhoven, The Netherlands) as the cathode and plated at 3 A/dm$^2$ DC for 20 min at 70° C. so as to give a 3.5-micron thick Co—W alloy metal deposit into the exposed channels of the grid pattern. The sample was removed from the plating bath and then rinsed for 5 mins in deionised water at room temperature followed by 10 mins in hot town water at 60° C. After rinsing and drying, the plated surface of the sample was hot roll laminated at 80° C. and 25 cm/min against a 10 micron thick adhesive (Formulation C) coated onto PET film (125 micron thick, DuPont Tejin Melinex ST505). The resulting laminate was UV cured by passing it 4 times under a 300 W/linear inch i-line UV lamp (H Bulb) at 2 cm/s and then baked for 30 mins at 80° C. The conducting carrier film was peeled off, leaving behind the adhesive-coated PET carrier film with conducting Co—W tracks embedded in the formulation B cured photopolymer resin dielectric matrix with highly planar surface. The composition of resulting Co—W alloy was measured using X-Ray fluorescence and found to be in the range 69 to 75% Co and 31 to 25% W. The surface resistance of the resulting film was measured to be 30 Ω/□.

Example 9

A sample was prepared as described in Example 1 up until the point after plasma treatment and before Co—W plating. The sample was placed into a Cobalt Tungsten electrolytic plating bath (containing sodium tungstate and cobalt sulfate, supplied by TNO Science and Industry, Eindhoven, The Netherlands) as the cathode and plated at 3 A/dm$^2$ DC for 6 min at 70° C. so as to give about a 1 micron thick Co—W alloy metal deposit into the exposed channels of the grid pattern. The sample was removed from the plating bath and rinsed for 5 mins in deionised water at room temperature. The sample was then further plated in an electrolytic Nickel sulphamate electro-plating bath (Nickal PC-8, Rohm&Haas,) in contact with the cathode bar. Nickel was plated onto the exposed Co—W plated regions until a minimum of 3 micron of Nickel was deposited (3.0 A/dm² DC for 5 min). The sample was removed from the plating bath and then rinsed for 5 mins in deionised water at room temperature followed by 10 mins in hot town water at 60° C. After rinsing and drying, the plated surface of the sample was hot roll laminated at 80° C. and 25 cm/min against a 10 micron thick adhesive (Formulation C) coated onto PET film (125 micron thick, DuPont Tejin Melinex ST505). The resulting laminate was UV cured by passing it 4 times under a 300 W/linear inch i-line UV lamp (H Bulb) at 2 cm/s and then baked for 30 mins at 80° C. The conducting carrier film was peeled off, leaving behind the adhesive-coated PET carrier film with conducting Nickel tracks embedded in the formulation B cured photopolymer resin dielectric matrix with highly planar surface. The surface resistance of the resulting film was measured to be 1.5 Ω/☐.

Example 10

A gold over Nickel composite electrode film with a square packed grid pattern, pitch 300 micron and line width of 5 micron was prepared by the method of Example 1. The films were cleaned by agitation in isopropanol and deionised water, followed by 30 sec treatment with an oxygen plasma (300 W, 225 mTorr, 50 cc/min $O_2$). PEDOT:PSS with low work function of 4.8 eV (ORGACON development code 3494676, AGFA Materials, Mortsel, Belgium with 10% by weight additional isopropanol added) was coated by bar coating. After coating, the substrates were baked at 140° C. for 20 minutes to drive off residual solvents.

Example 11

This example describes the preparation of the composite electrode onto a releasable carrier substrate. A sample was prepared as described in Example 1 up until the point where it had been plated rinsed and dried. A sheet of Revalpha NWS-TS322F SHT (Nitto Denko, Japan) was roll laminated, to the surface of the embedding dielectric material (Formulation B) at room temperature, pressure of 4 bar and speed of 1 m/min, so that the releasing adhesive side of the Revalpha film was in contact with the surface of the embedding dielectric material (Formulation B). The Revalpha film comprised a foaming acrylic type adhesive (80 micron thick) on top of a 38 micron thick PET film on top of a pressure sensitive adhesive layer (30 micron thick). Removable PET film liner layers cover the two adhesive layers. The conducting carrier film was peeled off, leaving behind the Revalpha foaming thermal release adhesive-coated PET carrier film with conducting Nickel tracks embedded in the formulation B cured photopolymer resin dielectric matrix with highly planar surface. A sheet of DuPont Teijin Teonex Q65FA PEN film of thickness 125 micron was coated with PEDOT:PSS (Clevios CPP105D, H C Stark) by bar coating. After coating, the PEN film was baked at 140° C. for 20 minutes to drive off residual solvents. The dry PEDOT:PSS coating thickness was measured to be 100 nm. The planar composite electrode mounted onto the Revalpha releasing adhesive film was hot laminated to the PEDOT:PSS coating by passing it through a hot roll laminator at temperature of 170° C., speed 0.1 m/min, nip pressure 4 bar. The foaming adhesive is designed to act like a standard pressure sensitive adhesive until it is heated above a certain activation temperature for >1 min. The heat from the hot roll lamination caused the highly planar surface of the composite electrode to bond to the PEDOT:PSS layer and the releasing adhesive to activate, causing the foaming adhesive layer to loose adhesion to the embedding dielectric. After the hot roll lamination, the Revalpha carrier sheet was easily removed, leaving the composite electrode bonded and in electrical contact with the PEDOT:PSS coating on the PEN carrier film.

Referring now to FIGS. 11-22, FIG. 11 illustrates a method 1100 of manufacturing a composite electrode according to various aspects of the present disclosure, FIGS. 12 and 13 illustrate two possible process embodiments 1200 and 133, respectively, for providing a second substrate layer at 1104 in FIG. 11, FIG. 14 shows an overall process flow for one fabrication process embodiment, and FIGS. 15-22 illustrate fabrication of a composite electrode and various intermediate stages of production.

A conducting carrier layer is provided at 1102 in FIG. 11 as a first substrate layer with an electrically conducting receptive surface, an example of which is shown at 1401 in the process 1400 of FIG. 14.

At 1104 in FIG. 11, a second substrate layer is provided, which is transparent in certain embodiments at a wavelength of radiation used to cure a radiation curable material, and which has a surface relief pattern defining at least one retaining feature corresponding to a desired metal track pattern. Two possible embodiments 1200 and 1300 are shown in FIGS. 12 and 13, respectively, for providing the second substrate layer at 1104 in FIG. 11.

Figure 16:
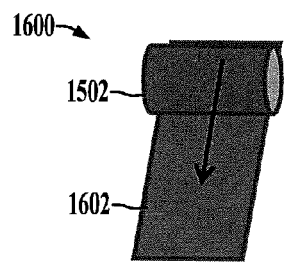
Figure 16:
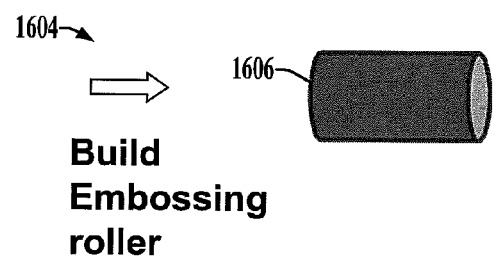
Figure 17:
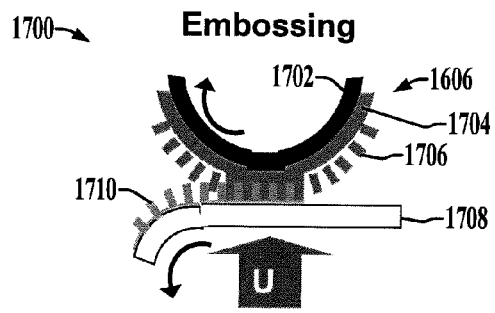

In the example process 1200 of FIG. 12, a photoresist flexible master is provided at 1202 on film (e.g., channels) using a photomask design of a desired metal track pattern at 1202 (e.g., master plate 1502 in the view 1500 of FIG. 15), and the master film (1602 in the view 1600 of FIG. 16) is used at 1204 to emboss a surface relief pattern onto a transfer film comprising a flexible mould (embossing 1604 to provide mould 1606 in FIG. 16, also illustrated at 1402 in FIG. 14). At 1206 in FIG. 12, the flexible mould is used to emboss the surface relief pattern (e.g., channels) onto the circumference of a roller in the form of a UV cured surface relief, and the roller is used at 1208 to emboss a UV curable coating onto a real of UV transparent film to provide a flexible mould tool 1606 (FIGS. 16 and 17) with a surface relief pattern 1706. As seen in the view 1700 of FIG. 17, the UV curable coating 1710 is formed on the UV transparent film 1708 using the tool 1606, where the tool 1606 in one example includes a roller structure 1702 on which is formed the transfer film structure 1704 with the surface relief pattern 1706. At 1210 in FIG. 12, the reel of the flexible mould is used to emboss a surface relief pattern (e.g., channels) onto the surface of a conducting carrier of a first substrate.

In the embodiment 1300 of FIG. 13, a photoresist flexible master is provided at 1302 on film (e.g., channels) using a photomask design of a desired metal track pattern, and the master film is used at 1304 to emboss a surface relief pattern in a UV curable material onto a transfer film comprising a flexible mould. At 1306, the reel is used to emboss a surface relief pattern (e.g., channels) onto the surface of a conducting carrier which is a first substrate in certain embodiments.

Figure 18:
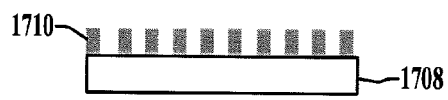

As seen in FIG. 18, a second substrate or UV transparent polymer mould tool is thus provided with a second substrate layer 1708 having a surface relief pattern 1710.

Figure 19:
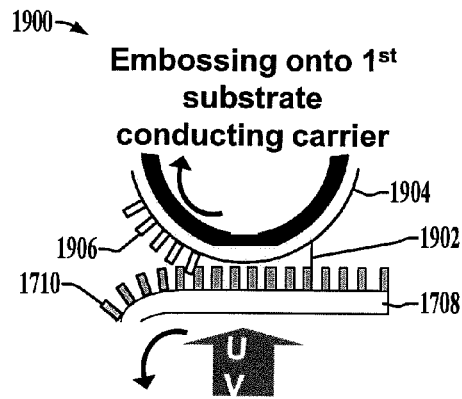
Figure 20:
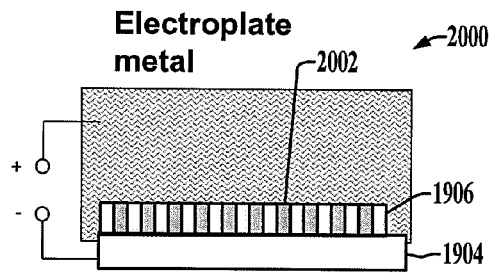

Returning to 1106 in FIG. 11, a UV curable resin is deposited onto at least part of the surface relief pattern or the electrically conducting surface along a line of contact formed between the conducting carrier layer and at least part of the surface relief pattern. This is further illustrated in 1404 and 1406 in FIG. 14 and interview 1900 of FIG. 19. As shown in FIG. 19, a line of contact is formed between a conducting carrier layer 1904 and at least a part of the surface relief pattern 1710 of the second substrate 1708, and UV curable material 1902 is deposited into at least part of the surface relief pattern 1708 or the electrically conducting surface along the line of contact, and the line of contact is advanced in the direction of the arrows in FIG. 19. At 1108 in FIG. 11, UV exposure is provided in this embodiment (from the bottom in FIG. 19) to cure the curable material 1902 through the second substrate layer 1708. At 1110 in FIG. 11, and as further shown in FIG. 19, this process releases the cured material 1906 from at lease part of the surface relief pattern 1710 in order to leave behind a transferred surface relief pattern 1906 on the conducting carrier layer 1904, thereby exposing the electrically conducting surface. A plasma etch may be performed, for example, as shown at 1408 in FIG. 14, to further expose the electrically conducting surface if needed.

Also at 1110 in FIG. 11 (and as further shown in the view 2000 of FIG. 20, and at 1410 in FIG. 14), a first metal layer 2002 is deposited onto the exposed regions of the electrically conducting surface of the conducting carrier layer 1904, for example, by electrochemically depositing metal tracks via an electroplating process in one example.

Figure 21:
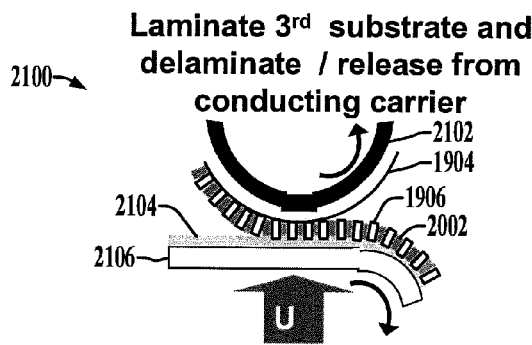
Figure 22:
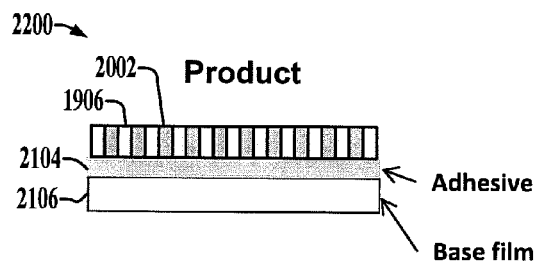

Referring also to the view 2100 of FIG. 21, an adhesive layer 2104 is deposited over the transferred surface relief pattern 1906 on the conducting carrier layer 1904 (see also 1412, 1414 and 1416 in FIG. 14), for example, via a roller structure 2102, and the adhesive layer 2104 is contacted to a third substrate layer 2106, for example through lamination, or another material providing a supporting substrate 2106 may be deposited in a temporary or permanent manner at 1112 in FIG. 11 in other embodiments. The process of FIG. 21 further provides for separation or removal of the first substrate (conducting carrier layer 1904) leaving the resulting composite electrode product shown in the viewed 2200 of FIG. 22 having the third substrate layer 2106 operating as a base film with the adhesive 2104 and the metal electrode features 2002 separated by embedded dielectric material 1906, where the finished product may be formed into a roll of the mesh film as shown at 1418 in FIG. 14.

The invention claimed is:

1. A method of manufacturing a composite electrode comprising the steps of:
   providing a conducting carrier layer being a first substrate layer with an electrically conducting surface;
   providing a non-conducting at least radiation curable material;
   providing a second substrate layer which is transparent at a wavelength of radiation used to cure the radiation curable material and which has a surface relief pattern defining at least one retaining feature corresponding to a desired metal track pattern;
   forming a line of contact between the conducting carrier layer and at least a part of the surface relief pattern;
   depositing the curable material onto at least part of the surface relief pattern or the electrically conducting surface along the line of contact;
   advancing the line of contact and curing the curable material through the second substrate layer;
   releasing the cured material from the at least part of the surface relief pattern feature so as to leave behind a transferred surface relief pattern on the conducting carrier layer;
   selectively removing at least part of the transferred surface relief pattern so as to selectively expose the electrically conducting surface of the conducting carrier layer;
   depositing a first metal layer onto the exposed regions of the electrically conducting surface of the conducting carrier layer;
   depositing an adhesive layer over the transferred surface relief pattern on the conducting carrier layer after metal deposition;
   contacting the adhesive layer to a third substrate layer;
   and removing the conducting carrier layer,
   wherein the conducting carrier layer has a surface roughness such that adhesion between the conducting carrier layer and the first metal layer is not promoted.

2. A method of manufacturing a composite electrode as claimed in claim 1, wherein after depositing the first metal layer onto the exposed regions of the electrically conducting surface of the conducting carrier layer the steps of depositing an adhesive layer over the surface relief pattern on the conducting carrier layer after metal deposition and contacting the adhesive layer to a third substrate layer are replaced by depositing a material suitable to form a supporting substrate, before removing the conducting carrier layer.

3. A method of manufacturing a composite electrode as claimed in claim 1, wherein the conducting carrier layer is removed by immersing the composite electrode in a bath containing a liquid solution in which the electrically conducting surface is selectively soluble.

4. A method of manufacturing a composite electrode as claimed in claim 1, including:
   the further step, after removal of the conducting carrier layer, of removal of some of the first metal layer by chemical etching.

5. A method of manufacturing a composite electrode as claimed in claim 4, including the yet further step of plating further metal onto the composite electrode to provide an alternative metal surface to the composite electrode or to increase the top surface area of the electrode.

6. A method of manufacturing a composite electrode as claimed in claim 1, wherein depositing a metal layer includes metallic ink printing.

7. A method of manufacturing a composite electrode as claimed in claim 1, wherein the conducting carrier layer has a roughness profile with a maximum height of less than 150 nm.

8. A method of manufacturing a composite electrode as claimed in claim 1, wherein the surface roughness of the conducting carrier layer provides a reflective finish on the surface of the first metal layer and the cured material.

9. A method of manufacturing a composite electrode as claimed in claim 1, wherein the surface roughness of the conducting carrier layer provides an interface for separating the first metal layer and the cured material from the conducting carrier layer without causing damage to at least one of the surface of the conducting carrier layer, the first metal layer, and the cured material.

10. A method of manufacturing a composite electrode as claimed in claim 1, further including depositing a transparent conducting layer on a portion of the first metal layer and the cured material.

11. A method of manufacturing a composite electrode as claimed in claim 1, wherein the conducting carrier layer has a surface roughness of less than 20 nm.

* * * * *